(12) United States Patent
Koyama

(10) Patent No.: US 7,652,289 B2
(45) Date of Patent: Jan. 26, 2010

(54) SEMICONDUCTOR DEVICE

(75) Inventor: Jun Koyama, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 274 days.

(21) Appl. No.: 11/785,460

(22) Filed: Apr. 18, 2007

(65) Prior Publication Data
US 2007/0252153 A1 Nov. 1, 2007

Related U.S. Application Data

(62) Division of application No. 10/987,005, filed on Nov. 15, 2004, now Pat. No. 7,208,763, which is a division of application No. 09/986,742, filed on Nov. 9, 2001, now Pat. No. 6,831,299.

(30) Foreign Application Priority Data

Nov. 9, 2000 (JP) ............................. 2000-342016

(51) Int. Cl.
*H01L 29/10* (2006.01)
(52) U.S. Cl. .............................. 257/66; 257/70; 257/500
(58) Field of Classification Search .................. 257/70, 257/66, 72, 500; 438/151, 157, 283
See application file for complete search history.

(56) References Cited

U.S. PATENT DOCUMENTS

| | | | |
|---|---|---|---|
| 4,330,363 A | 5/1982 | Biegesen et al. | |
| 4,466,179 A | 8/1984 | Kasten | |
| 4,781,437 A | 11/1988 | Shields et al. | |
| 4,797,629 A | 1/1989 | Widlar | |

(Continued)

FOREIGN PATENT DOCUMENTS

EP     0 091 806     10/1983

(Continued)

OTHER PUBLICATIONS

Yoneda et al., "A Smart Arrangement of TFTs in Low-Temperature Poly-Silicon Circuitry for Achieving Higher Effective Yield in Production", Conference Record of The 1997 International Display Research Conference and International Workshops on LCD Technology and Emissive Technology, pp. L1-L4, 1997.

(Continued)

*Primary Examiner*—Andy Huynh
*Assistant Examiner*—David Goodwin
(74) *Attorney, Agent, or Firm*—Nixon Peabody, LLP; Jeffrey L. Costellia

(57) ABSTRACT

In a conventional analog buffer circuit composed of polycrystalline semiconductor TFTs, a variation in the output is large. Thus, a measure such as to provide a correction circuit has been taken. However, there has been such a problem that a circuit and driver operation are complicated. Therefore, a gate length and a gate width of a TFT composing an analog buffer circuit is set to be larger. Also, a multi-gate structure is adopted thereto. In addition, the arrangement of channel regions is devised. Thus, the analog buffer circuit having a small variation is obtained without using a correction circuit, and a semiconductor device having a small variation can be provided.

35 Claims, 25 Drawing Sheets

U.S. PATENT DOCUMENTS

| | | | |
|---|---|---|---|
| 5,135,607 A | 8/1992 | Hirai | |
| 5,145,808 A | 9/1992 | Sameshima et al. | |
| 5,153,702 A | 10/1992 | Aoyama et al. | |
| 5,166,671 A | 11/1992 | Maekawa | |
| 5,194,853 A | 3/1993 | Asada | |
| 5,247,375 A | 9/1993 | Mochizuki et al. | |
| 5,250,852 A | 10/1993 | Ovens et al. | |
| 5,264,383 A | 11/1993 | Young | |
| 5,335,023 A | 8/1994 | Edwards | |
| 5,357,290 A | 10/1994 | Horibe | |
| 5,365,875 A | 11/1994 | Asai et al. | |
| 5,372,836 A | 12/1994 | Imahashi et al. | |
| 5,403,762 A | 4/1995 | Takemura | |
| 5,413,958 A | 5/1995 | Imahashi et al. | |
| 5,432,122 A | 7/1995 | Chae | |
| 5,432,527 A | 7/1995 | Yanai et al. | |
| 5,471,225 A | 11/1995 | Parks | |
| 5,477,073 A | 12/1995 | Wakai et al. | |
| 5,525,813 A | 6/1996 | Miyake et al. | |
| 5,529,630 A | 6/1996 | Imahashi et al. | |
| 5,576,222 A | 11/1996 | Arai et al. | |
| 5,589,406 A * | 12/1996 | Kato et al. | 438/164 |
| 5,594,569 A | 1/1997 | Konuma et al. | |
| 5,597,740 A | 1/1997 | Ito et al. | |
| 5,620,905 A * | 4/1997 | Konuma et al. | 438/163 |
| 5,643,826 A | 7/1997 | Ohtani et al. | |
| 5,648,277 A | 7/1997 | Zhang et al. | |
| 5,659,513 A | 8/1997 | Hirose et al. | |
| 5,680,149 A | 10/1997 | Koyama et al. | |
| 5,734,366 A | 3/1998 | Kubota et al. | |
| 5,764,206 A * | 6/1998 | Koyama et al. | 345/80 |
| 5,767,529 A * | 6/1998 | Kobori et al. | 257/66 |
| 5,789,763 A | 8/1998 | Kato et al. | |
| 5,798,742 A | 8/1998 | Watatani et al. | |
| 5,808,595 A * | 9/1998 | Kubota et al. | 345/92 |
| 5,844,535 A | 12/1998 | Itoh et al. | |
| 5,900,854 A | 5/1999 | Itoh et al. | |
| 5,923,962 A | 7/1999 | Ohtani et al. | |
| 5,942,856 A | 8/1999 | Koyama | |
| 5,945,970 A | 8/1999 | Moon et al. | |
| 5,956,581 A | 9/1999 | Yamazaki et al. | |
| 5,990,877 A | 11/1999 | Yeo | |
| 6,037,923 A | 3/2000 | Suzuki | |
| 6,054,976 A | 4/2000 | Kubota et al. | |
| 6,057,183 A | 5/2000 | Koyama et al. | |
| 6,069,605 A | 5/2000 | Ozawa | |
| 6,090,650 A | 7/2000 | Dabral et al. | |
| 6,246,387 B1 | 6/2001 | Yamazaki | |
| 6,268,842 B1 | 7/2001 | Yamazaki et al. | |
| 6,331,718 B1 | 12/2001 | Yamazaki et al. | |
| 6,496,171 B2 | 12/2002 | Yamazaki | |
| 6,521,912 B1 * | 2/2003 | Sakama et al. | 257/57 |
| 6,563,270 B1 | 5/2003 | Koyama | |
| 6,620,659 B2 | 9/2003 | Emmma et al. | |
| 6,703,953 B2 * | 3/2004 | Maeda et al. | 341/144 |
| 6,831,299 B2 * | 12/2004 | Koyama | 257/70 |
| 7,211,961 B2 | 5/2007 | Koyama | |
| 7,522,159 B2 * | 4/2009 | Miyata et al. | 345/204 |
| 2002/0139980 A1 * | 10/2002 | Yamazaki | 257/72 |
| 2006/0164359 A1 * | 7/2006 | Kimura | 345/92 |
| 2007/0196959 A1 | 8/2007 | Koyama | |

FOREIGN PATENT DOCUMENTS

| | | |
|---|---|---|
| EP | 0 657 863 A2 | 6/1995 |
| JP | 58-127318 | 7/1983 |
| JP | 59-161014 | 9/1984 |
| JP | 02-001893 | 1/1990 |
| JP | 03-095969 A | 4/1991 |
| JP | 04-282869 | 10/1992 |
| JP | 05-001893 A | 1/1993 |
| JP | 05-175235 | 7/1993 |
| JP | 05-203977 | 8/1993 |
| JP | 07-092501 | 4/1995 |
| JP | 07-130652 | 5/1995 |
| JP | 07-135318 | 5/1995 |
| JP | 07-162788 A | 6/1995 |
| JP | 07-294961 | 11/1995 |
| JP | 08-062637 | 3/1996 |
| JP | 08-078329 | 3/1996 |
| JP | 08-172049 | 7/1996 |
| JP | 10-197896 | 7/1998 |
| JP | 11-214700 | 8/1999 |
| JP | 11-338439 | 12/1999 |
| JP | 2000-022462 | 1/2000 |

OTHER PUBLICATIONS

Specification and Drawings for U.S. Appl. No. 09/275,426, "Driving Circuit of a Semiconductor Display Device and the Semiconductor Device" Filing Date: Mar. 24, 1999, Inventors: Jun Koyama et al.

Fujieda et al., "Self-Referenced Poly-Si TFT Amplifier Readout for a Linear Image Sensor", pp. 587-590, 1993, IEDM 22.7.1.

Bonnel et al., "Polycrystalline Silicon Thin-Film Transistors with Two-Step Annealing Process", pp. 551-553, Dec. 1993, IEEE Electron Device Letters, vol. 14, No. 12.

Fuse et al., "Performance of Poly-Si Thin Film Transistors Fabricated by Excimer-Laser Annealing of SiH4-and Si2H6 Source Low Pressure Vapor Deposited a-Si Films with or without Solid-Phase Crystallization", pp. 565-570,1994, Solid State Phenomena vols. 37-38.

Ohtani et al., "LP-B: Late-News Poster: A 60-in. HDTV Rear-Projector with Continuous-Grain-Silicon Technology", pp. 467-470, 1998, SID 98 Digest.

Specification, Drawings and Amendment for U.S. Appl. No. 09/300,133, "Thin Film Transistor Circuit and a Semiconductor Display Device Using the Same", Filing Date: Apr. 27, 1999, Inventors: Shunpei Yamazaki et al.

Yoshida et al., "33.2: A Full-Color Thresholdless Antiferroelectric LCD Exhibiting Wide Viewing Angle with Fast Response Time", pp. 841-844, 1997, SID 97 Digest.

Furue et al., "P-78: Characteristics and Driving Scheme of Polymer-Stabilized Monostable FLCD Exhibiting Fast Response Time and High Contrast Ratio with Gray-Scale Capability", pp. 782-785, 1998, SID 98 Digest.

* cited by examiner

Fig. 6 Prior Art

○ GI:950Å
△ GI:1150Å gate width is 8 μm gate width is 200 μm

Fig. 20A  characteristic of input and output in buffer circuit
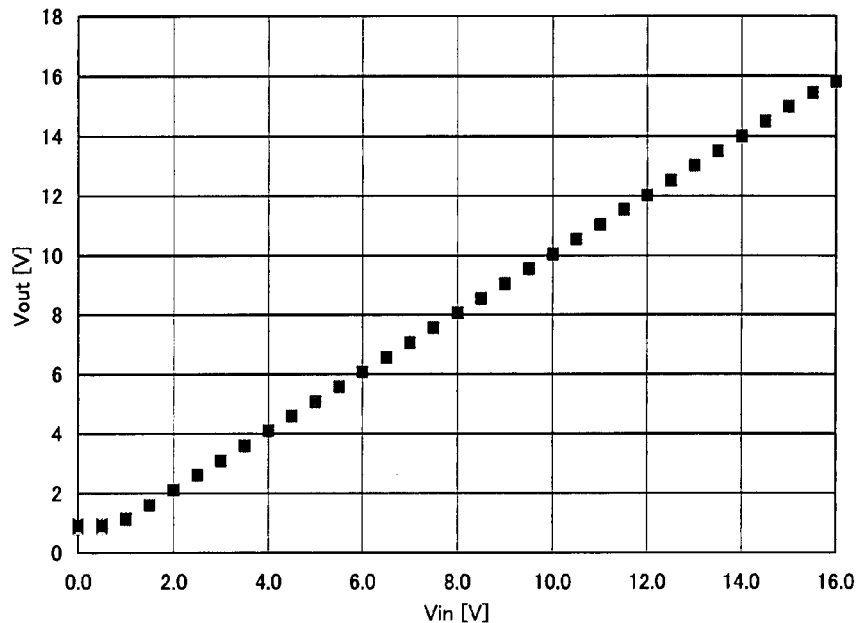
Fig. 20B
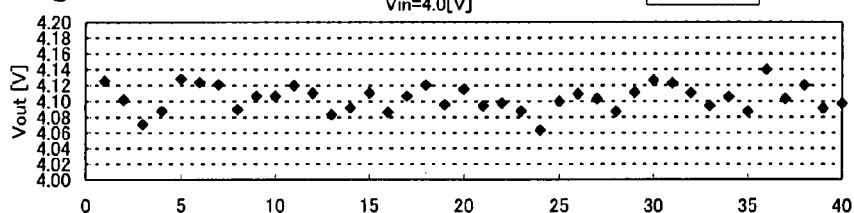
Fig. 20C
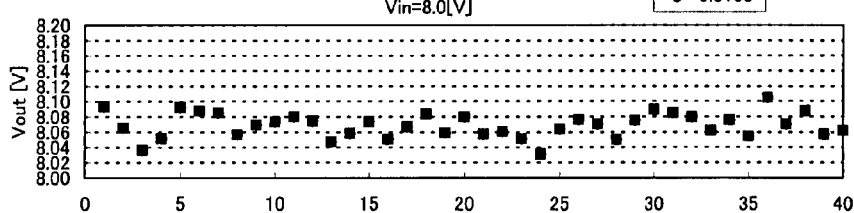
Fig. 20D
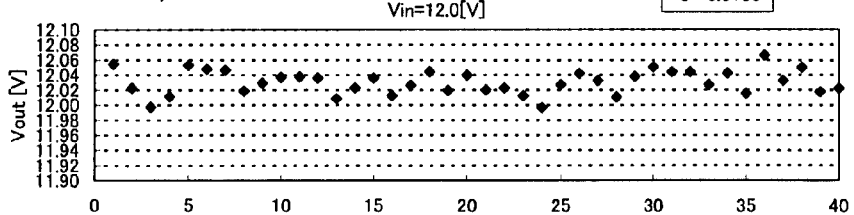

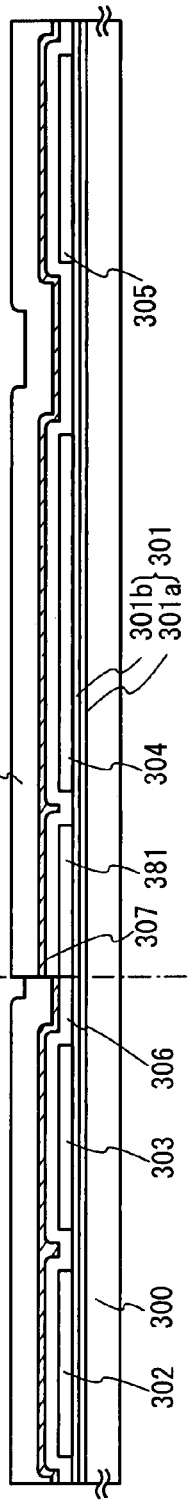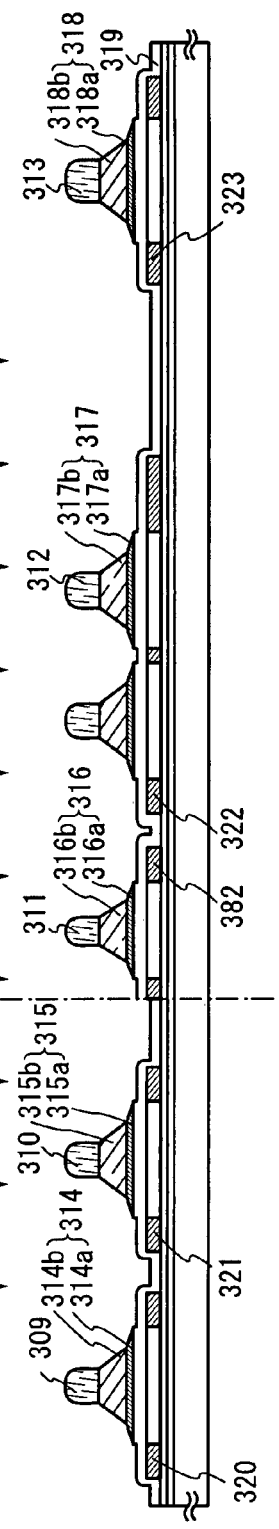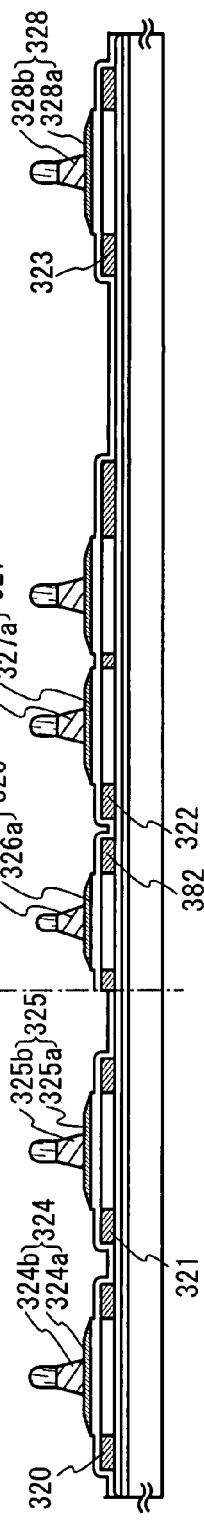
Fig. 21A  semiconductor layer formation/insulating film formation/formation of first and second conductive films
Fig. 21B  first etching process/first doping process
Fig. 21C  second etching process

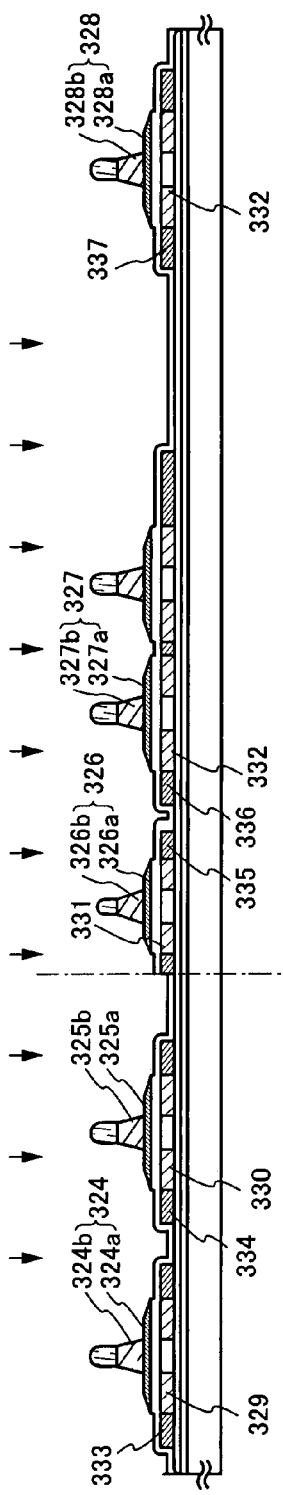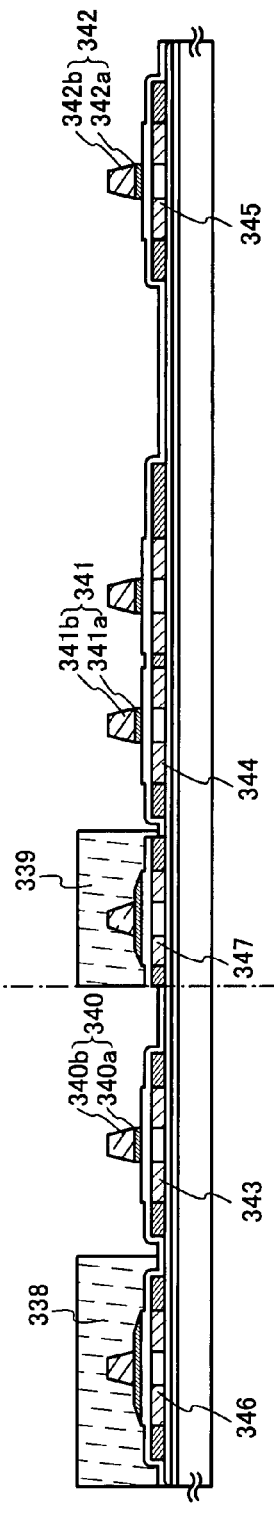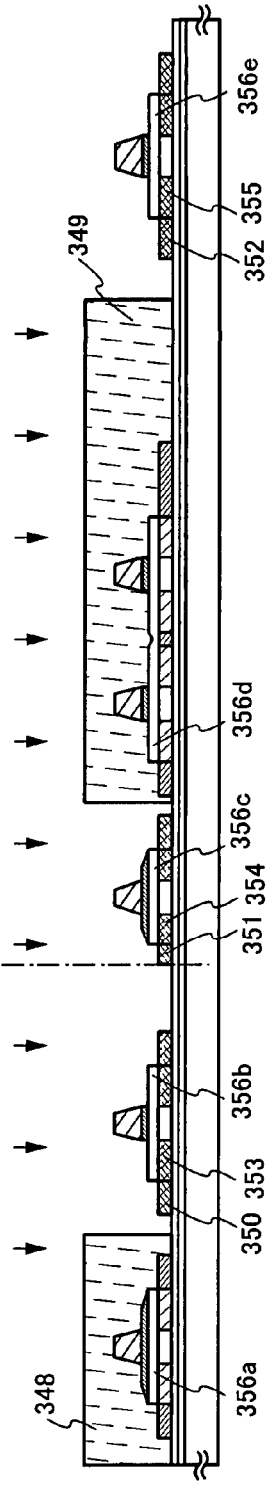

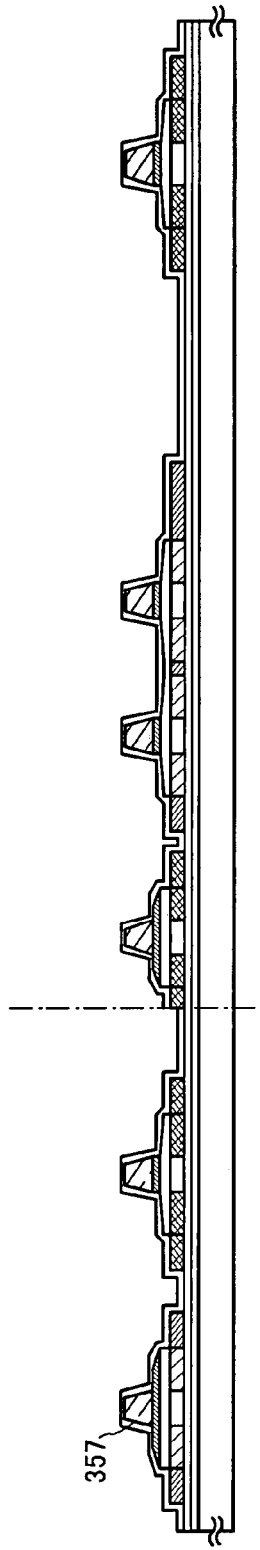
Fig. 23A  formation of first interlayer insulating film, activating process
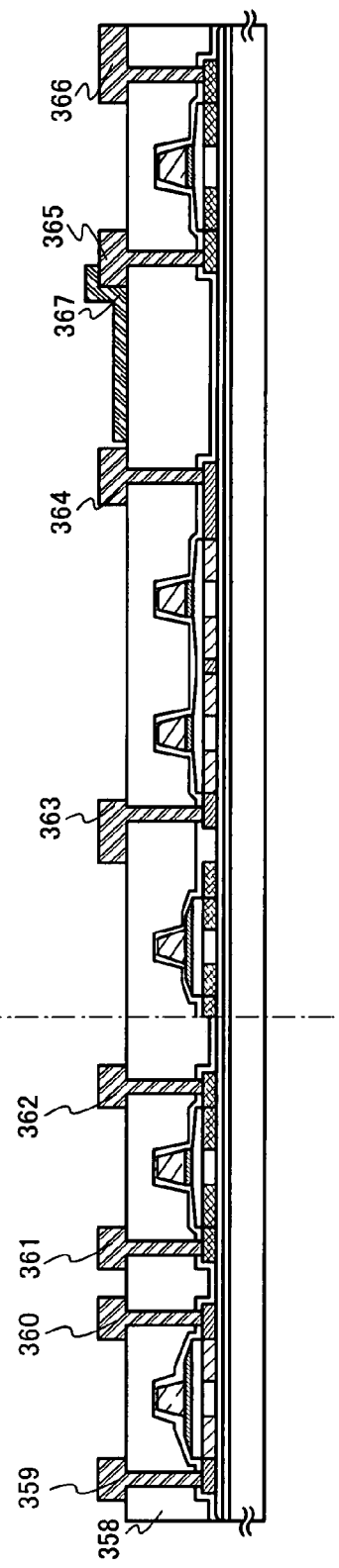
Fig. 23B  formation of second interlayer insulating film, wiring, pixel electrode

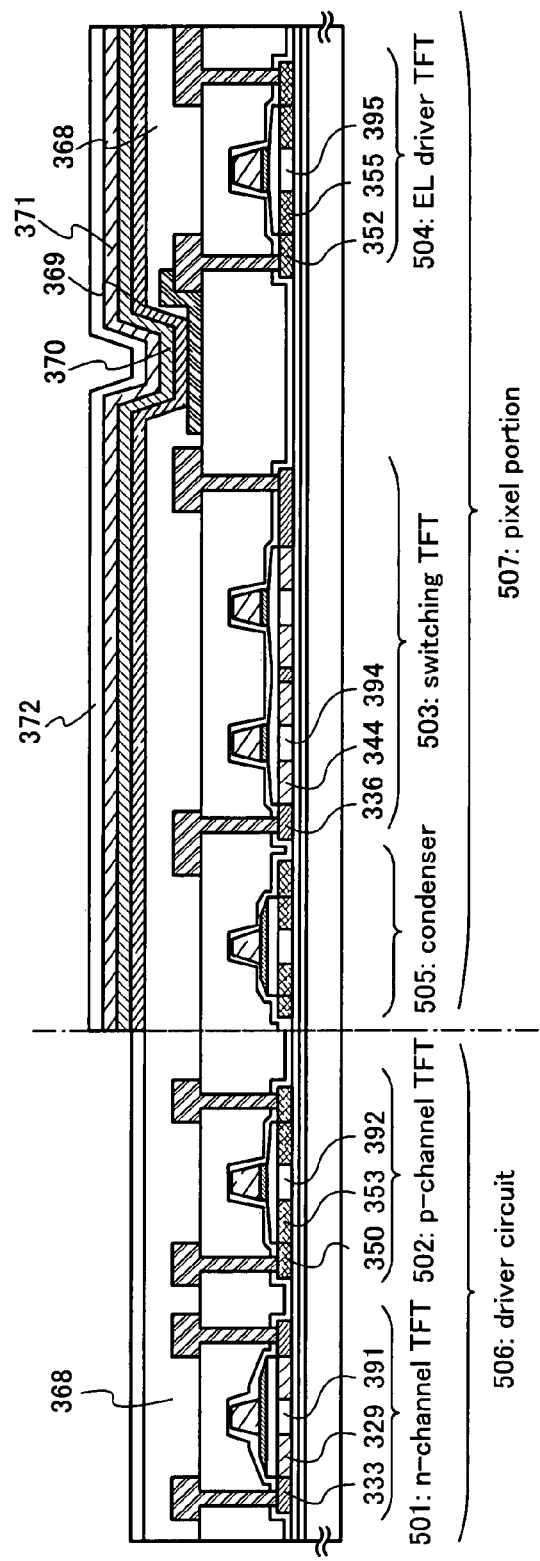
Fig. 24 formation of third interlayer insulating film, EL layer, pixel electrode, passivation film

SEMICONDUCTOR DEVICE

This application is a Divisional of application Ser. No. 10/987,005 filed Nov. 15, 2004, now U.S. Pat. No. 7,208,763, which is a Divisional of 09/986,742 filed Nov. 9, 2001, now U.S. Pat. No. 6,831,299.

BACKGROUND OF THE INVENTION

1. Field of the Invention

The present invention relates to a semiconductor device, and more specifically, to a semiconductor device having an analog buffer circuit composed of TFTs (thin film transistors) including polycrystalline semiconductor layers. Also, the present invention relates to a semiconductor device as an image display device.

2. Description of the Related Art

In recent years, the demand for information communications equipment is increased in accordance with the outspread of information communications. Here, a display device for displaying an image is essential for the information communications equipment. As the display device, there are a liquid crystal display device using liquid crystal, an EL (electroluminescence) display device using an EL element and the like. However, in accordance with the attempt to upsize a display portion and to make it have higher resolution, an active matrix display device in which a TFT is arranged in each pixel is becoming the mainstream.

FIG. 8 is a block diagram of an active matrix display device. A source signal line driver circuit and a gate signal line driver circuit are located around a pixel portion. The pixel portion, the source signal line driver circuit, and the gate signal line driver circuit are integrally formed on a substrate. Signals outputted from the source signal line driver circuit are inputted to source signal lines and transmitted to respective pixels. Also, signals outputted from the gate signal line driver circuit are inputted to gate signal lines and transmitted to respective pixels. The pixel portion is constructed by using liquid crystal, an EL element or the like. Here, an example of a structure of a pixel in the case where EL element is used will be shown in FIG. 15.

Note that an EL element in this specification includes both an element for producing luminescence (fluorescence) from a singlet state and an element for producing luminescence (phosphorescence) from a triplet state.

The gate electrode of a switching TFT is connected with a gate signal line. One of a source region and a drain region is connected with a source signal line and the other is connected with one electrode of a capacitor and a gate electrode of an EL driver TFT. The other electrode of the capacitor, which is not connected with the switching TFT, is connected with a power source supply line. One of the source region and the drain region of the EL driver TFT is connected with the power source supply line and the other is connected with an EL element.

A method of driving a pixel with the above structure will be briefly described.

In the pixel of which gate signal line is selected, an analog signal voltage inputted from the source signal line is applied to the capacitor and the gate electrode of the EL driver TFT through a switching TFT which becomes to be in a conduction state. By this applied voltage, a current flows from the power source supply line to the EL element or in its reverse direction through the EL driver TFT. The EL element emits light with an intensity corresponding to the flowed current.

In order to miniaturize the display device and reduce a manufacturing cost, manufacturing a pixel portion and a driver circuit portion (source signal line driver circuit and gate signal line driver circuit) on a single substrate is attempted. At this time, TFTs composing the pixel portion and the driver circuit portion are manufactured using polycrystalline semiconductor layers.

Here, a structure of the source signal line driver circuit for outputting analog signals to the source signal lines will be described. Note that the source signal line driver circuit for outputting analog signals to x (x is natural number) source signal lines is assumed. As a drive method of the source signal line driver circuit, a point sequential drive and a line sequential drive are exemplified.

First, the point sequential drive will be described. In the point sequential drive, signals are inputted to the source signal lines in succession one by one. A block diagram of the source signal line driver circuit of the point sequential drive is shown in FIG. 9.

The source signal line driver circuit is composed of a shift register 901, an analog signal input line 903 and switching circuits 904 (SW.1 to SW.x), and outputs signals to source signal lines S1 to Sx.

In accordance with sampling signals from the shift register 901, an analog signal voltage inputted from the analog signal input line 903 is outputted to the source signal lines S1 to Sx in succession through the switching circuits 904 (SW.1 to SW.x).

At this time, when a length of an effective horizontal scan period is indicated by a symbol Hi (about 80% of a horizontal scan period) and the number of source signal lines (the number of pixels in a transverse direction) is indicated by a symbol N, a period which can be used for inputting a signal to one source signal line becomes H1/N.

This drive method has such an advantage to be able to simplify the structure of the driver circuit. However, in the display device having a large display portion and one having a high resolution, since N becomes larger, a signal output period per pixel H1/N is shortened, and thus cannot be sufficiently set. Therefore, the line sequential drive which will be described next is mainly made.

A block diagram of the source signal line driver circuit with the line sequential drive is shown in FIG. 10.

The source signal line driver circuit shown in FIG. 10 is composed of a shift register 101, an analog signal input line 103, a signal transfer line 106, retaining capacitors 105 and 108, first switching circuits (SW1.1 to SW1.x) 104, second switching circuits (SW2.1 to SW2.x) 107, and analog buffer circuits (AB.1 to AB.x) 109. In accordance with sampling signals from the shift register 101, an analog signal inputted from the analog signal input line 103 is sampled and retained in the retaining capacitors 105 through the first switching circuits 104. After the signals corresponding to one line is retained, these signals are retained in the next retaining capacitors 108 through the second switching circuits 107 in accordance with a signal inputted to the signal transport line 106. Here, the retained signals corresponding to one line are simultaneously outputted to the source signal lines S1 to Sx. Here, while the signals are outputted to the source signal lines S1 to Sx, that is, immediately after the signals are outputted to the second switching circuits 107, signals corresponding to next one horizontal line are retained in succession from the analog signal input line into the retaining capacitors 105 through the first switching circuits 104.

According to this drive method, in the source signal line driver circuit, output signals corresponding to one horizontal line are retained first, and then simultaneously outputted to the source signal lines. Thus, even in the case of a display device having a large number of pixels, a period for outputting the signals to the source signal lines can be sufficiently set.

Here, when a large size panel is used, a load applied to per source signal line is increased. In order to reduce the influence of round of a signal due to the load, a signal amplifying circuit is required. Thus, in the block diagram shown in FIG. 10, the analog buffer circuits (AB.1 to AB.x) 109 are located as signal amplifying circuits before the signals are outputted to the source signal lines. An example of the analog buffer circuit is shown in FIG. 5.

In FIG. 5, the analog buffer circuit is composed of a differential circuit 5501, a current mirror circuit 5502 and a constant current source 5503. The differential circuit 5501 is composed of TFTs 5505 and 5506. The current mirror circuit 5502 is composed of TFTs 5507 and 5508. The constant current source 5503 is composed of a TFT 5504.

The gate electrodes of the TFTs 5507 and 5508 are connected with each other. One of the source region and the drain region of the TFT 5507 and one of the source region and the drain region of the TFT 5508 are connected with a power source line Vdd. The other of the TFT 5507 is connected with one of the source region and the drain region of the TFT 5505. The other of the TFT 5508 is connected with one of the source region and the drain region of the TFT 5506. The source region or the drain region of the TFT 5507, which is not connected with the power source line Vdd, is connected with the gate electrode thereof. One of the source region and the drain region of the TFT 5506, which is connected with the TFT 5508, is connected with the gate electrode of the TFT 5506 and an output terminal. The gate electrode of the TFT 5505 is connected with an input terminal to which an input signal is inputted. One of the source region and the drain region of the TFT 5504 is connected with the source region or the drain region of the TFT 5505, which is not connected with the TFT 5507 and the source region or the drain region of the TFT 5506, which is not connected with the TFT 5508. The other of the TFT 5504 is grounded. A bias voltage is inputted to the gate electrode of the TFT 5504.

An analog signal voltage inputted to the input terminal is impedance-converted to increase its current capacity and then outputted from the output terminal. Thus, even if a load of the source signal line for outputting the signal is large, the signal can be transmitted while suppressing the influence of round.

Note that an example of the source signal line driver circuit for inputting an analog signal and outputting analog signals is shown in FIGS. 9 and 10. On the other hand, with regard to a source signal line driver circuit for inputting digital signals, converting the digital signals into analog signals by digital/analog converters (D/A converters), and outputting signals to the source signal lines, in the same manner as described above, in the case of a large size panel, a line sequential drive is applied and analog buffer circuits are provided. An example of the source signal line driver circuit is shown in FIG. 18.

Note that an example of the source signal line driver circuit having a structure for inputting digital signals of 4 bits in parallel and sampling the digital signals is shown in FIG. 18.

In FIG. 18, the source signal line driver circuit is composed of a shift register, a digital signal input line VD, a latch 1 (LAT1,1 to LAT1,x), a latch 2 (LAT2,1 to LAT2,x), a latch pulse line, D/A converters (DAC1 to DACx), and analog buffer circuits (AB.1 to AB.x).

In accordance with timing signals from the shift register, signals are sampled from the digital signal input line VD to the latch 1, and signals corresponding to one line period are held in the latch 1.

Note that the digital signal input line VD is indicated by four wirings in FIG. 18. The four wirings correspond to a first bit signal to a fourth bit signal. In accordance with timing signals from the shift register, for every signal corresponding to the respective source signal lines, the first bit signal to the fourth bit signal are simultaneously sampled in the latch 1.

After that, in accordance with a latch pulse inputted to the latch pulse line, the signals corresponding to one line period are transferred to the latch 2. The signals in the latch 2 are converted into analog signals by the D/A converters. The converted analog signals are simultaneously transferred to the source signal lines S1 to Sx through the analog buffer circuits. Thus, an image is displayed by the line sequential drive.

It is assumed that the analog buffer circuit shown in FIG. 5 is constructed by using a TFT in which the channel region is made from a polycrystalline semiconductor layer. In this specification, the TFT in which the channel region is made from a polycrystalline semiconductor layer is called a polycrystalline TFT.

Here, in order to normally operate the analog buffer circuit, it is required that two (a pair of) TFTs composing a differential circuit have the same characteristic and two (a pair of) TFTs composing a current mirror circuit have the same characteristic. The fact that two TFTs have the same characteristic indicates another fact that identical drain currents are flowed at the time of applying the identical gate voltages to the two TFTs. However, in fact, the characteristics of these TFTs are greatly varied. This is because the characteristic of the TFT is greatly dependent on, for example, a crystallization state of the polycrystalline semiconductor layer of the channel region.

Thus, since offset voltages are generated against input voltages in the analog buffer circuits, output voltages by the respective analog buffer circuits are varied by the offset voltages. Therefore, such attempts as to provide correction circuits to reduce variations in output voltages from the analog buffer circuits are made. This method is disclosed in Japanese Patent Application Laid-open Nos. Hei 2-1893 and Hei 7-162788.

An example of a correction circuit proposed so far will be shown, and its operation will be described.

It is assumed that, when a standard voltage $V_o$ is inputted to the analog buffer circuit, an output voltage from the analog buffer circuit becomes $(V_o + \ddot{A}V)$ and thus a difference of an offset voltage $\ddot{A}V$ is produced. A correction circuit is added to the analog buffer circuit. The correction circuit detects a difference between the output voltage $(V_o + \ddot{A}V)$ and the standard voltage $V_o$ as the offset voltage $\ddot{A}V$ in the case where the standard voltage $V_o$ is inputted to the analog buffer circuit first. Thereafter, a voltage $(V - \ddot{A}V)$ obtained by subtracting the offset voltage $\ddot{A}V$ from an input signal voltage V is inputted to the analog buffer circuit. Thus, the offset voltage $\ddot{A}V$ is cancelled, and the voltage V is outputted as the output voltage of the analog buffer circuit.

A specific example of such a correction circuit will be described. Note that an example of the correction circuit disclosed in Japanese Patent Application Laid-open No. Hei 7-162788 will be described here.

Figure 6:
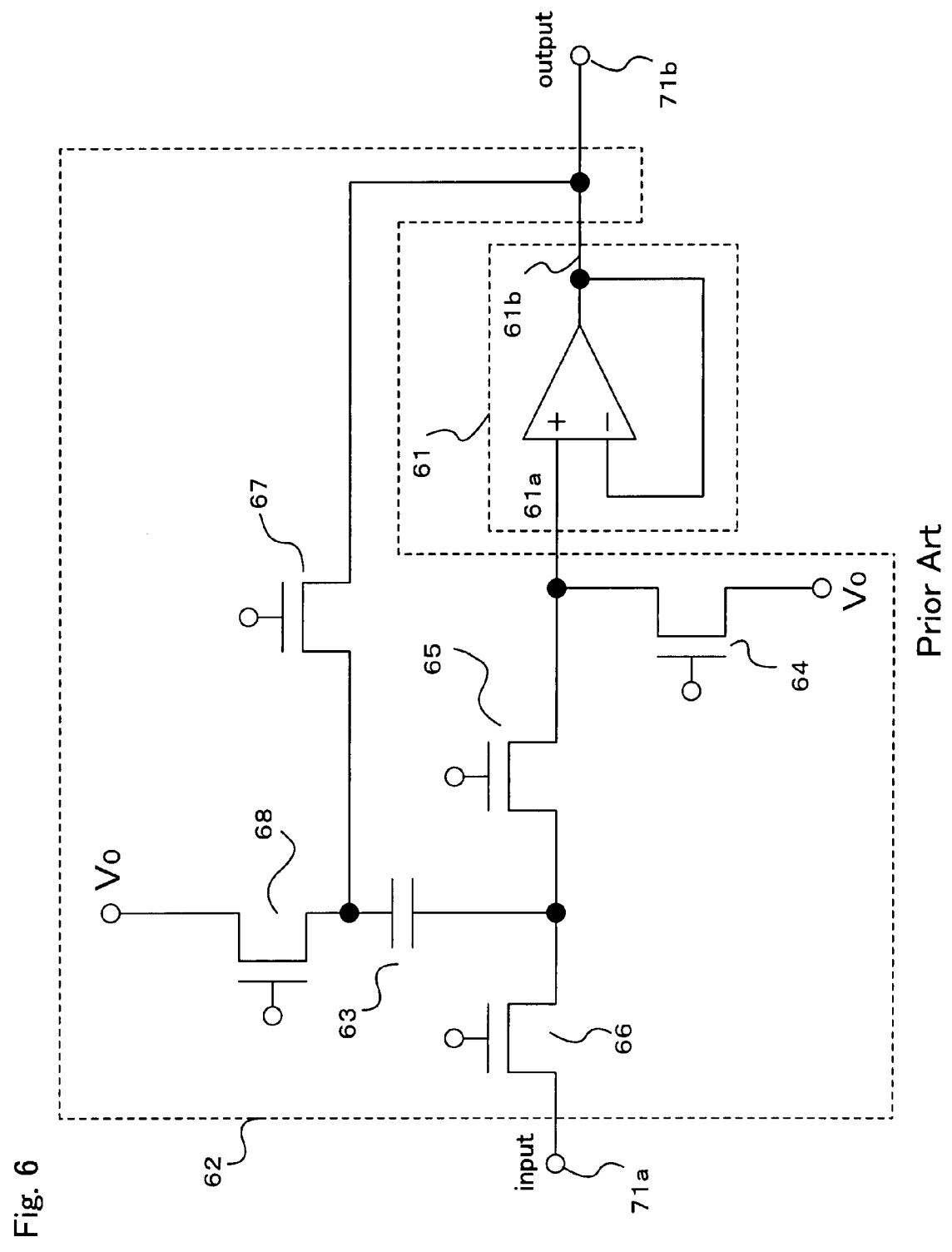

FIG. 6 shows an example of a circuit diagram of an analog buffer circuit 61 to which a correction circuit 62 is added. The correction circuit 62 is composed of a capacitor 63 and switching TFTs 64 to 68.

An input terminal 61a of the analog buffer circuit 61 is connected with a power source line $V_o$ through the switching TFT 64 and one electrode of the capacitor 63 through the switching TFT 65 at the same time. The electrode of the capacitor 63, which is connected with the switching TFT 65, is connected with an input terminal 71a of the correction circuit-equipped analog buffer circuit through the switching TFT 66.

The other electrode of the capacitor 63 is connected with the power source line $V_o$ through the switching TFT 68 and an output terminal 61b of the analog buffer circuit 61 through the switching TFT 67 at the same time. The output terminal 61b of the analog buffer circuit 61 corresponds to an output terminal 71b of the correction circuit-equipped analog buffer circuit.

It is assumed that signals $V_{g64}$ to $V_{g68}$ are respectively inputted to the gate electrodes of the switching TFTs 64 to 68.

The operation of FIG. 6 will be described using a timing chart shown in FIG. 7. Note that the timing chart shown in FIG. 7 corresponds to the case where n-channel TFTs are used as the switching TFTs 64 to 68. However, even when p-channel TFTs are used as the switching TFTs 64 to 68, there is no problem. In this case, the signals $V_{g64}$ to $V_{g68}$ have inverse phases as compared with the case where the n-channel TFTs are used.

First, at a time $t_1$, Hi level signal voltages are inputted to the signals $V_{g64}$, $V_{g65}$ and $V_{g67}$. On the other hand, Lo level signals are inputted to the signals $V_{g66}$ and $V_{g68}$. Thus, the switching TFTs 64, 65, and 67 are in a conduction state, and the switching TFTs 66 and 68 are in a non-conduction state.

At this time, the voltage $V_o$ on the power source line $V_o$ is inputted to the input terminal 61a of the analog buffer circuit 61 through the switching TFT 64 and applied to the capacitor 63 through the switching TFT 65.

Next, at a time $t_2$, the signals $V_{g64}$ and $V_{g67}$ are kept to be in the Hi level and the signal $V_{g68}$ is kept to be in the Lo level. However, when the level of the signal $V_{g65}$ is changed into the Lo level and that of the signal $V_{g66}$ is changed into the Hi level, the switching TFTs 64, 66, and 67 are in a conduction state, and the switching TFTs 65 and 68 are in a non-conduction state. Therefore, an input voltage V is inputted to the capacitor 63 through the switching TFT 66.

Thereafter, at a time $t_3$, while the switching TFTs 64 and 67 are kept in a conduction state, the level of the signal $V_{g66}$ is changed into the Lo level and thus the switching TFT 66 becomes to be in a non-conduction state.

Next, at a time $t_4$, the signal voltages of signals $V_{g64}$, $V_{g65}$ and $V_{g66}$ are not changed, the level of the signal $V_{g67}$ becomes the Lo level, and that of the signal $V_{g68}$ is changed into the Hi level. Then, the switching TFTs 64 and 68 are in a conduction state, and the switching TFTs 65, 66, and 67 are in a non-conduction state.

Therefore, the voltage $V_o$ on the power source line $V_o$ is applied to the electrode of the capacitor 63 through the switching TFT 68.

Thereafter, at a time $t_5$, the signal voltages of signals $V_{g66}$ to $V_{g68}$ are not changed, the level of the signal $V_{g64}$ becomes the Lo level, and that of the signal $V_{g65}$ becomes the Hi level. Then, the switching TFTs 65 and 68 are in a conduction state, and the switching TFTs 64, 66, and 67 are in a non-conduction state.

Therefore, a voltage between the electrodes of the capacitor 63 is inputted to the input terminal 61a of the analog buffer circuit 61 through the switching TFT 65.

Here, the voltage between the electrodes of the capacitor 63 is (V−ÄV). Thus, when this voltage is inputted to the analog buffer circuit 61, the output of the analog buffer circuit becomes V.

As described above, by providing the correction circuit 62, a voltage except the offset voltage ÄV can be outputted from the analog buffer circuit 61.

However, there is the following problem. That is, a $(t_5-t_1)$ period of time is required to correct the offset voltage ÄV. Also, new special signals are required to apply the signal voltages of signals $V_{g64}$ to $V_{g68}$. Therefore, a signal system is complicated and an increase in the number of elements is caused.

Note that not only the analog buffer circuit in which the correction circuit having the structure shown in FIG. 6 is provided but also an analog buffer circuit in which an correction circuit having another structure is provided are proposed. In any case, after an output of the analog buffer circuit is held once, an input voltage to the analog buffer circuit is changed based on the output voltage, and the offset voltage is removed from the output of the analog buffer circuit. Thus, there is a problem similar to the above matter.

SUMMARY OF THE INVENTION

In an analog buffer circuit including a differential circuit, a current mirror circuit, and a constant current source, a structure and an arrangement of polycrystalline TFTs composing the circuits are devised, to thereby reduce a difference of characteristics of the respective TFTs. Also, a plurality of TFTs are used to operate a circuit based on average characteristics of these TFTs. Thus, an analog buffer circuit having a small variation is provided.

Hereinafter, structures of the present invention will be described.

According to the present invention, there is provided a semiconductor device including an analog buffer circuit composed of a thin film transistor having a channel region made from a polycrystalline semiconductor, characterized in that;

the analog buffer circuit has at least one of a differential circuit and a current mirror circuit; and the thin film transistor composing one of the differential circuit and the current mirror circuit has a gate length (or a channel length) of 7 µm or longer and a gate width (or a channel width) of 50 µm or longer.

According to the present invention, there is provided a semiconductor device including an analog buffer circuit composed of a thin film transistor having a channel region made from a polycrystalline semiconductor, characterized in that;

the analog buffer circuit has at least one of a differential circuit and a current mirror circuit; and the thin film transistor composing one of the differential circuit and the current mirror circuit has a multi-gate structure.

According to the present invention, there is provided a semiconductor device including an analog buffer circuit composed of a thin film transistor having a channel region made from a polycrystalline semiconductor, characterized in that;

the analog buffer circuit has at least one of a differential circuit and a current mirror circuit; and the thin film transistor composing one of the differential circuit and the current mirror circuit is composed of a plurality of thin film transistors which are connected in parallel.

A semiconductor device may be characterized in that the plurality of thin film transistors are located in a cross arrangement.

According to the present invention, there is provided a semiconductor device including an analog buffer circuit composed of a thin film transistor having a channel region made from a polycrystalline semiconductor, characterized in that;

the analog buffer circuit is constructed of a source follower; and the thin film transistor composing the source follower has a gate length of 7 μm or longer and a gate width of 50 μm or longer.

According to the present invention, there is provided a semiconductor device including an analog buffer circuit composed of a thin film transistor having a channel region made from a polycrystalline semiconductor, characterized in that;

the analog buffer circuit is constructed of a source follower; and the thin film transistor composing the source follower has a multi-gate structure.

BRIEF DESCRIPTION OF THE DRAWINGS

In the accompanying drawings:

FIG. 6 is a circuit diagram of a conventional correction circuit-equipped analog buffer circuit;

FIGS. 20A to 20D are diagrams showing characteristics of the analog buffer circuit of the present invention;

FIGS. 21A to 21C are diagrams showing a method of manufacturing an EL display device according to the present invention;

FIGS. 22A to 22C are diagrams showing the method of manufacturing the EL display device according to the present invention;

FIGS. 23A and 23B are diagrams showing the method of manufacturing the EL display device according to the present invention; and FIG. 24 is a diagram showing the method of manufacturing the EL display device according to the present invention.

DETAILED DESCRIPTION OF THE PREFERRED EMBODIMENTS

A structure of an analog buffer circuit of the present invention will be described.

A polycrystalline TFT is used as an element composing the analog buffer circuit. Crystallinity of a polycrystalline semiconductor layer in the channel region of the TFT is a large factor for determining a characteristic of the TFT.

Here, when the channel region is made from the polycrystalline semiconductor layer, an interface (crystal grain boundary) between polycrystalline grains (crystal grains) becomes a problem. Differing from the inner portion of the crystal grain, the crystallinity of the crystal grain boundary is disturbed. Also, since there is a problem such as segregation of an impurity, the crystal grain boundary serves as a barrier for blocking the movement of a carrier. Thus, the characteristic of the TFT is greatly changed in accordance with the degree of the crystal grain boundary existed in the channel region of the TFT.

In recent years, fineness of the TFT is progressed and the TFT in which a width of the channel region is equal to a size of crystal grain is formed. Thus, the characteristic of the TFT is greatly changed depending on as to whether the crystal grain boundary is existed or not in the channel region.

Figure 16A:
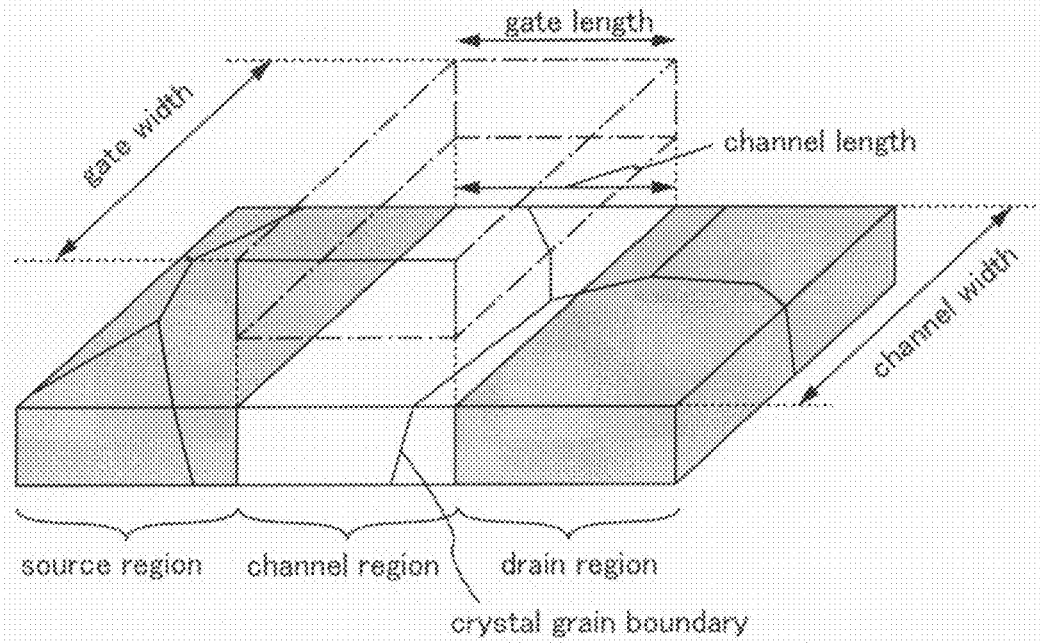
FIGS. 16A and 16B are diagrams showing the relationship between a crystal grain boundary and the channel region in the polycrystalline semiconductor.
Figure 16B:
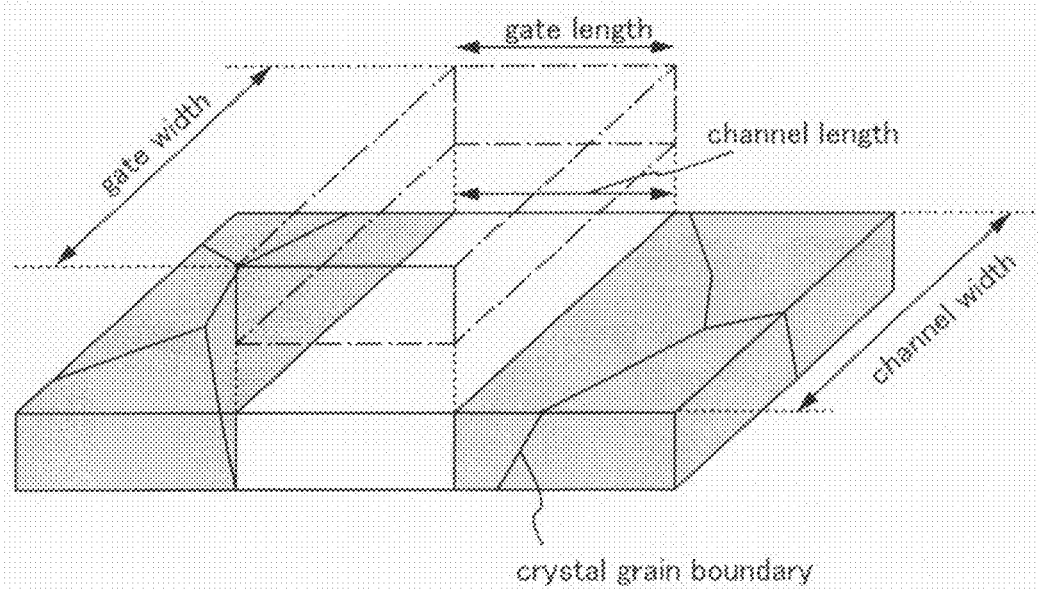

An arrangement of a crystal grain boundary in a polycrystalline semiconductor layer and a relationship between the crystal grain boundary and the channel region are schematically shown in FIGS. 16A and 16B.

In FIG. 16A, since the crystal grain boundary is existed so as to cross the channel region, a carrier is influenced by the crystal grain boundary and thus the mobility is decreased. On the other hand, in FIG. 16B, the channel region is located right in the inner portion of the crystal grain and the crystal grain boundary is not existed. In this case, it is assumed that the carrier moves through the inner portion of substantially a single crystal. Therefore, the mobility is higher compared with FIG. 16A.

Thus, the characteristic of the TFT is changed depending on as to whether the crystal grain boundary is existed or not in the channel region. Also, even if the crystal grain boundary is existed in the channel region, a variation in the characteristics of the respective TFTs becomes larger in accordance with the number of grain boundaries.

Figure 14:
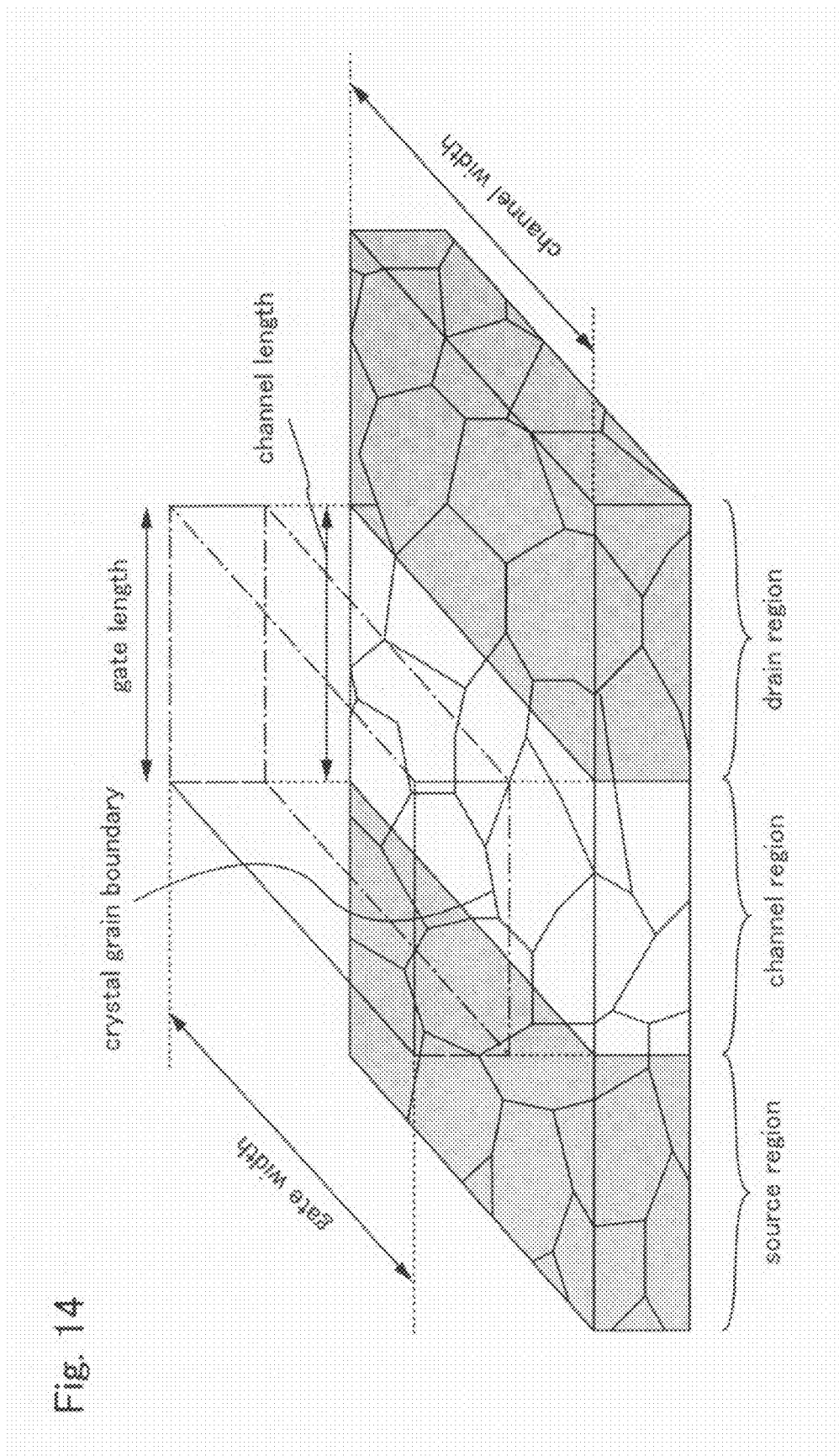
FIG. 14 is a diagram showing a relationship between a crystal grain boundary and a channel region in polycrystalline semiconductor.
Figure 15:
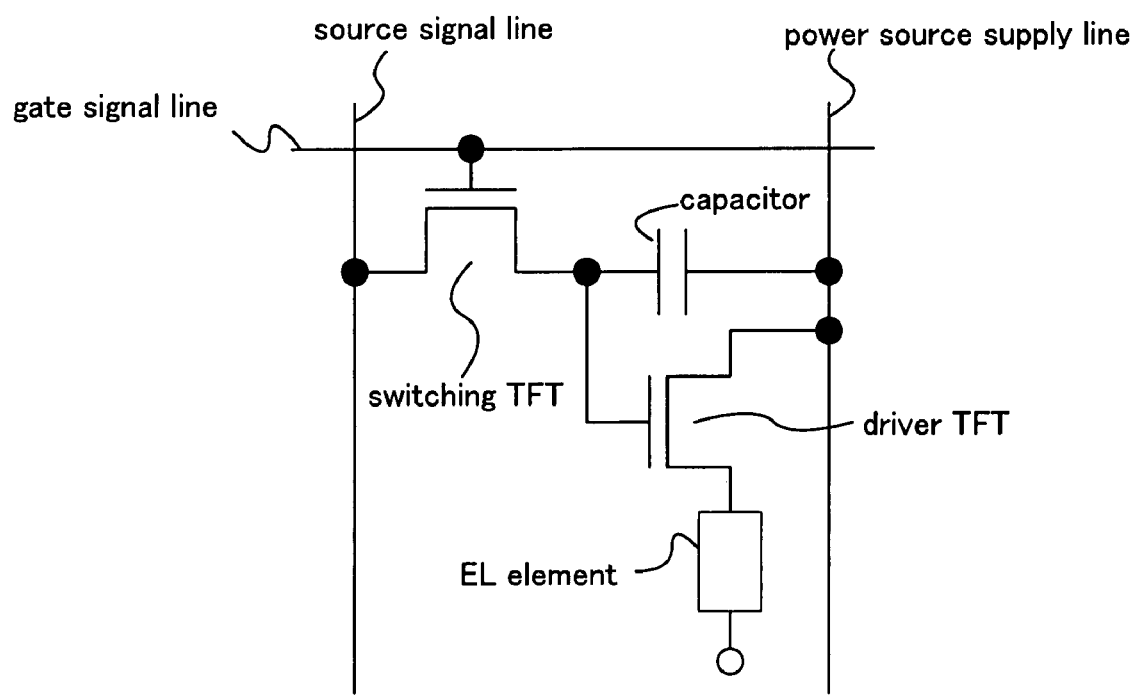
FIG. 15 is a diagram showing a structure of a pixel of an EL display device.

It is preferable that a variation between the respective TFTs in the number of grain boundaries, which becomes an obstacle, in the case where the carrier transmits the channel region becomes smaller. Therefore, as a first embodiment mode, the gate length (the channel length) and the gate width (the channel width) of a TFT in the analog buffer circuit are made long to increase the number of crystal grains included in the channel region. The schematic view of the above is shown in FIG. 14. Thus, TFTs having relatively identical characteristics are obtained.

Figure 19A:
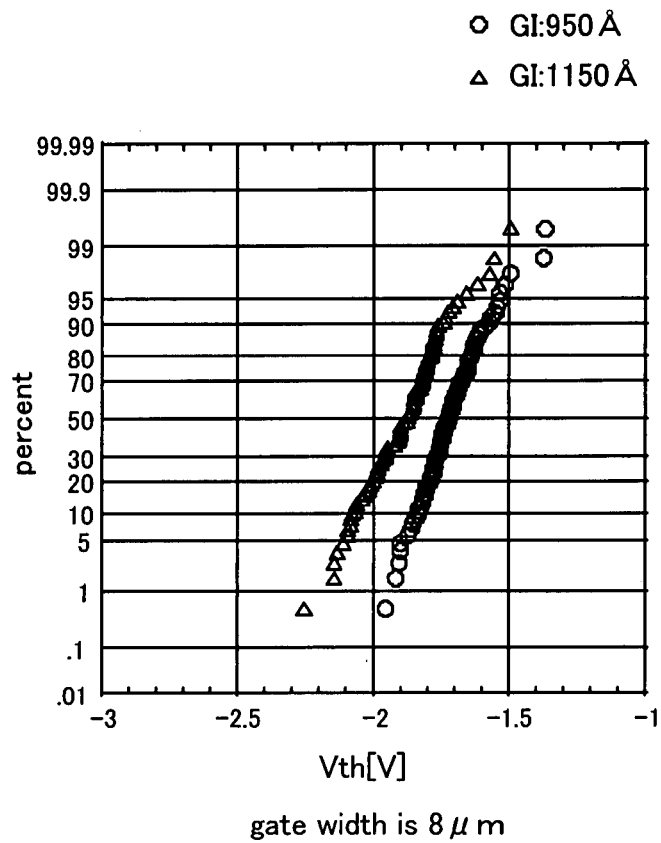
FIGS. 19A and 19B are diagrams showing a relationship of a variation between a gate width and a threshold value characteristic in a TFT.
Figure 19B:
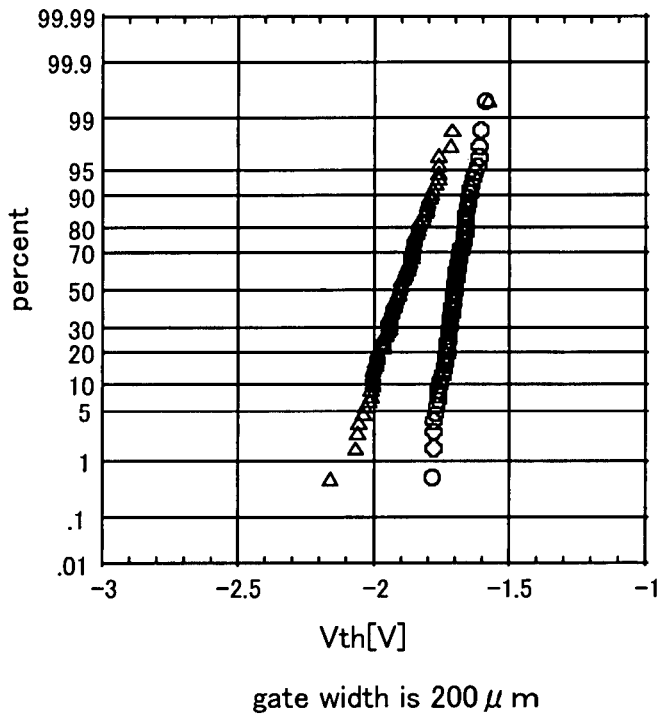

FIGS. 19A and 19B show variations in threshold values (Vth) of a TFT having a gate width of 8 μm and a TFT having a gate width of 200 μm. FIG. 19A shows a variation in the threshold value of the TFT having a gate width of 8 μm, and FIG. 19B shows a variation in the threshold value of the TFT having a gate width of 200 μm. Here, these drawings show measurement results in the case where a gate oxide film (GI) has 950 angstroms and the case where the gate oxide film (GI) has 1150 angstroms.

From FIGS. 19A and 19B, it is apparent that a variation in the threshold value of the TFT having a longer gate width becomes smaller.

It is desirable that the gate width is 50 μm or longer.

Figure 4:
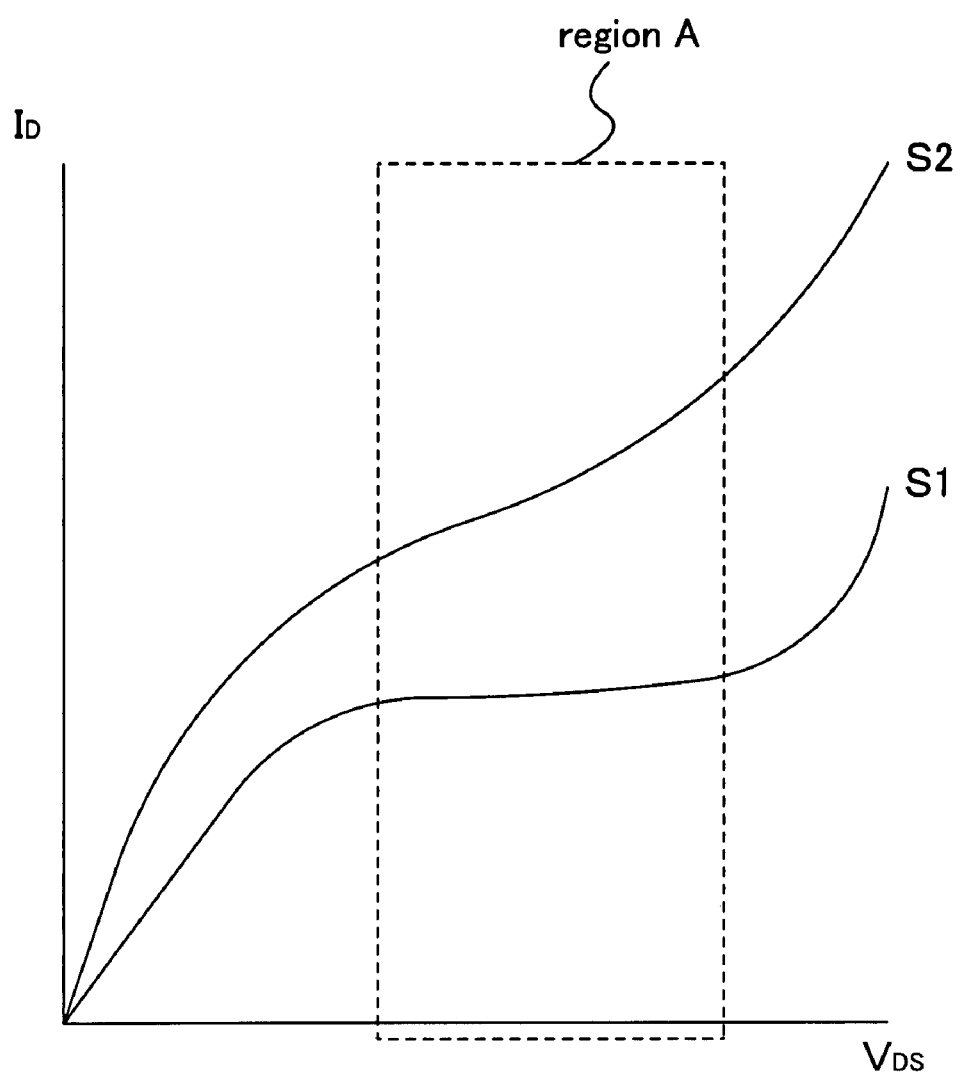
FIG. 4 is a diagram showing a relationship between a drain current and a source-drain voltage with respect to a gate length.

Also, there is a relationship as shown in a graph of FIG. 4 among a gate length, a drain current $I_D$, and a drain-source voltage $V_{DS}$ of a TFT.

Generally, with regard to an TFT (field effect transistor), since the length of a depletion layer is changed depending on a drain voltage, and thus an effective channel length is changed. As the channel length is shorter, relative influence is increased.

Reference symbol $S_2$ denotes a curve indicating a characteristic of the drain current $I_D$ to the drain-source voltage $V_{DS}$ of a TFT in which a gate length L is relatively short.

On the other hand, reference symbol $S_1$ denotes a curve indicating a characteristic of the drain current $I_D$ to the drain-source voltage $V_{DS}$ of a TFT in which a gate length L is relatively long. As can be seen from this graph, a change in the drain current $I_D$ is smaller than that in the drain-source voltage $V_{DS}$ in a region A in the case of the TFT having a long gate length, as compared with that of the TFT having a short gate length. Therefore, when the gate length L is increased, a TFT in which a characteristic variation is small is obtained. In the present invention, the TFT having the structure that the gate length is the same long as the channel width is shown.

In order to attain the above, it is desirable that a gate length is 7 μm or longer.

Also, as a second embodiment mode, in order to suppress a characteristic variation in a TFT, the TFT is formed as a multi-gate type. Owing to it, such a TFT has a plurality of channel regions and a characteristic of the TFT is averaged, to thereby be able to obtain the TFT in which a variation is small. Also, in the case of the TFT having a multi-gate structure, a high electric field around the drain is relaxed, and the generation of a hot carrier can be suppressed. Therefore, the deterioration of the TFT can be prevented. Further, this becomes a measure against the above depletion layer.

As a third embodiment mode, a plurality of TFTs are connected in parallel and the gate electrodes of the respective TFTs are made to have a common potential, and thus such a structure is used as one element. Therefore, an element having an averaged characteristic is obtained.

Here, the plurality of TFTs which are connected in parallel and have a common gate electrode potential is called a set of TFTs in this specification. That is, the differential circuit and the current mirror circuit each are composed of two sets (pairs) of TFTs. Thus, if average characteristics of the two sets (pairs) of TFTs are identical, a problem with respect to an offset voltage in the analog buffer circuit can be solved.

As a fourth embodiment mode, a method of devising the arrangement of a plurality of TFTs composing a set of TFTs and making average characteristics of two sets of TFTs identical will be described.

First, a film formation method, which is an important factor for determining crystallinity of a polycrystalline semiconductor thin film will be described. First, a method of using a laser, which is widely used in general, will be described.

This is a method of irradiating an amorphous semiconductor thin film with laser light for crystallization.

Here, as a size of a panel is increased, it becomes more difficult to simultaneously polycrystallize the entire panel. That is, since it is difficult to uniformly irradiate the entire surface of the panel with laser light, nonuniformity in irradiation is caused depending on the position of the panel. Thus, characteristics of a polycrystalline semiconductor films are greatly changed.

Therefore, in accordance with upsizing of the panel, a laser irradiation method which will be described below is proposed. For example, it is devised that a linear laser is used to successively shift a position of the linear laser, to thereby obtain polycrystalline thin films having uniform characteristics. However, due to overlapping at the time of successively moving the linear laser and a variation in irradiation energy of the laser itself, it is difficult to obtain polycrystalline semiconductor films having uniform characteristics in its entire surface.

Thus, when the channel regions of the TFTs are formed vertically in a scan direction of the linear laser, that is, at positions extremely near a line to be simultaneously irradiated, TFTs having relatively similar characteristics can be obtained.

Also, as another crystallization method, there is a method of using a metal catalyst and heating an amorphous semiconductor layer to crystallize it.

According to this method, a metal catalyst is added to the amorphous semiconductor layer, and heated to diffuse and move the metal catalyst. Thus, the crystallization of the amorphous semiconductor layer is promoted along a path of this movement.

Since the crystallization is promoted from an addition region of the metal catalyst taken as a center, a characteristic of the polycrystallized semiconductor layer is varied in accordance with a distance from the addition region. Thus, when the channel regions of the TFTs are located in positions where the distances from the addition region of the metal catalyst are equal, TFTs having relatively identical characteristics can be obtained.

Note that the crystallization method using the laser and the crystallization method using the metal catalyst can be used in combination.

In an analog buffer circuit of the present invention, TFTs are arranged with taking into consideration the above matters. A schematic view showing this arrangement is shown in FIGS. 11A and 11B.

Figure 11A:
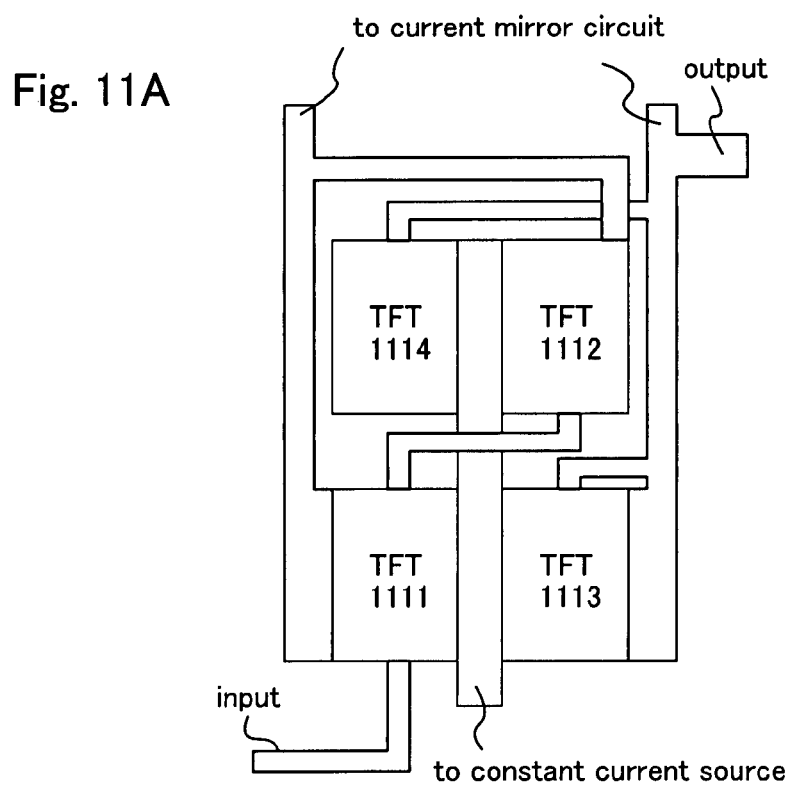
FIGS. 11A and 11B are a plan view and a circuit diagram showing the arrangement of TFTs, respectively.
Figure 11B:
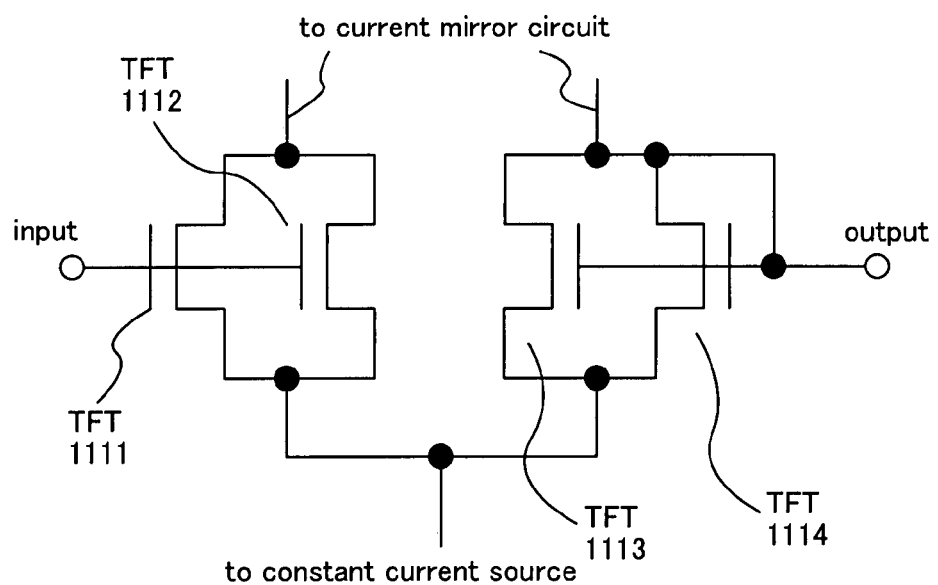

Note that an example of a differential circuit in which two TFTs with a common gate electrode potential are connected in parallel as a set of TFTs and which operates based on the average characteristic of the set of TFTs is shown in FIGS. 11A and 11B. However, in the case of a current mirror circuit, TFTs can be arranged in the same manner.

FIG. 11A is a top schematic view showing the arrangement of the TFTs. Also, FIG. 11B is a circuit diagram of FIG. 11A. A comparison between FIG. 11A and FIG. 11B is made.

In FIG. 11A, with regard to TFTs 1111 to 1114 composing a differential circuit, the TFT 1111 and 1112 are composing one set of TFTs and the TFT 1113 and 1114 are composing the other set of TFTs. Here, in FIG. 11B, the channel regions of the TFTs 1111 and 1112 are located in a position geometrically symmetrical about a point and the channel regions of the TFTs 1113 and 1114 are located in the position geometrically symmetrical about a point. Positions of symmetrical centers in these two sets coincide with each other. According to this structure, a variation in crystallinity dependent on a position and another variation in manufacturing can be averaged by the arrangement of the channel regions in the plurality of TFTs. Therefore, two sets of TFTs having relatively identical characteristics are obtained, and thus an analog buffer circuit having a small variation is obtained.

As shown in FIG. 11A, a variation in crystallinity dependent on a position and another variation in manufacturing can be reduced by a so-called cross arrangement.

Note that, if a variation in crystallinity can be averaged by the arrangement of the channel regions of a plurality of TFTs, the arrangement of the channel regions in the TFTs is not limited to that symmetrical around a point as shown in FIGS. 11A and 11B.

Also, it is not required that a set of TFTs is composed of two TFTs. It may be composed of two TFTs or more. When more TFTs are connected in parallel and a circuit is operated using its average characteristic, a circuit having a smaller variation is obtained.

A characteristic variation in the TFTs is suppressed by the first embodiment mode to the fourth embodiment mode, which are described above, and the influence due to the characteristic variation of the TFTs is reduced. Thus, an analog buffer circuit having a reduced offset voltage is obtained.

Note that the first embodiment mode to the fourth embodiment mode can be embodied by freely combining each of them.

For example, a structure in which the first embodiment mode is combined with the second embodiment mode, that is, a structure in which a plurality of gate electrodes in a multi-gate TFT each have a gate width of 50 μm or longer and a gate length of 7 μm or longer corresponding to the respective gate electrodes, is effective.

Also, a structure in which the first embodiment mode is combined with the third embodiment mode, that is, a structure in which a plurality of TFTs which have a common gate electrode potential and are connected in parallel each have a gate width of 50 μm or longer and a gate length of 7 μm or longer, is effective.

Hereinafter, embodiments of the present invention will be described.

Embodiment 1

Figure 1:
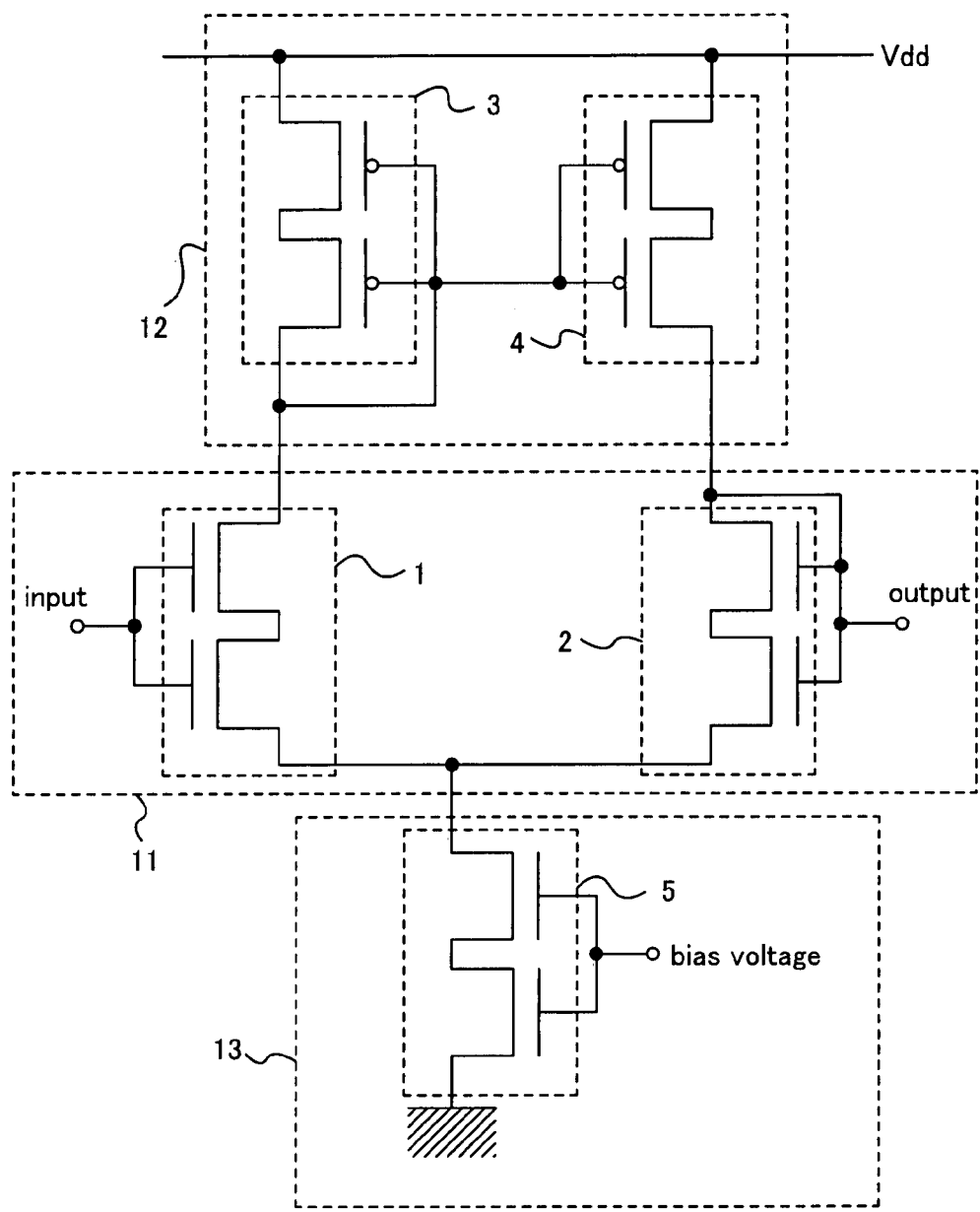
FIG. 1 is a circuit diagram of an analog buffer circuit of the present invention.

An example of an analog buffer circuit of the present invention is shown in FIG. 1.

Figure 5:
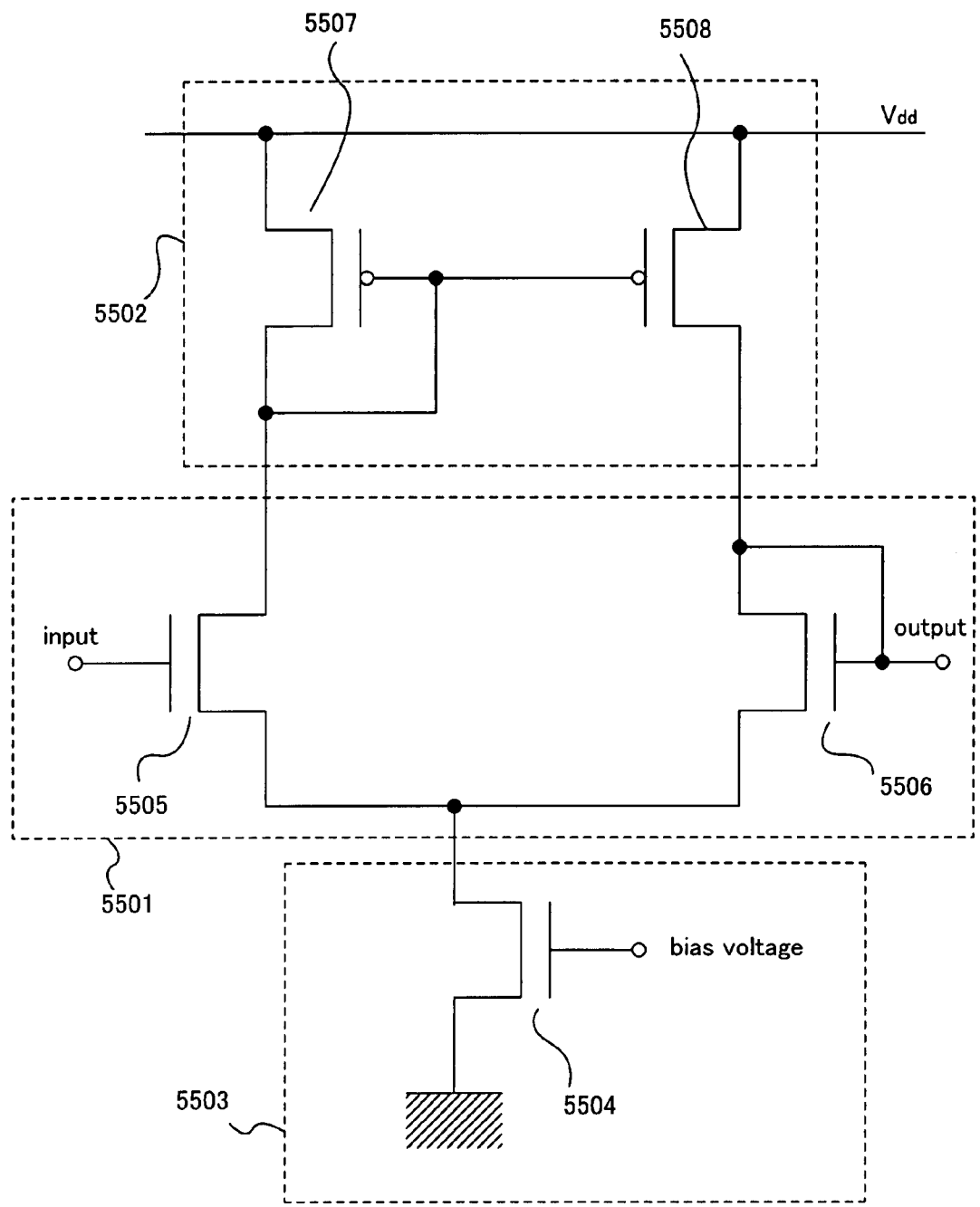
FIG. 5 is a circuit diagram of a conventional analog buffer circuit.
Figure 7:
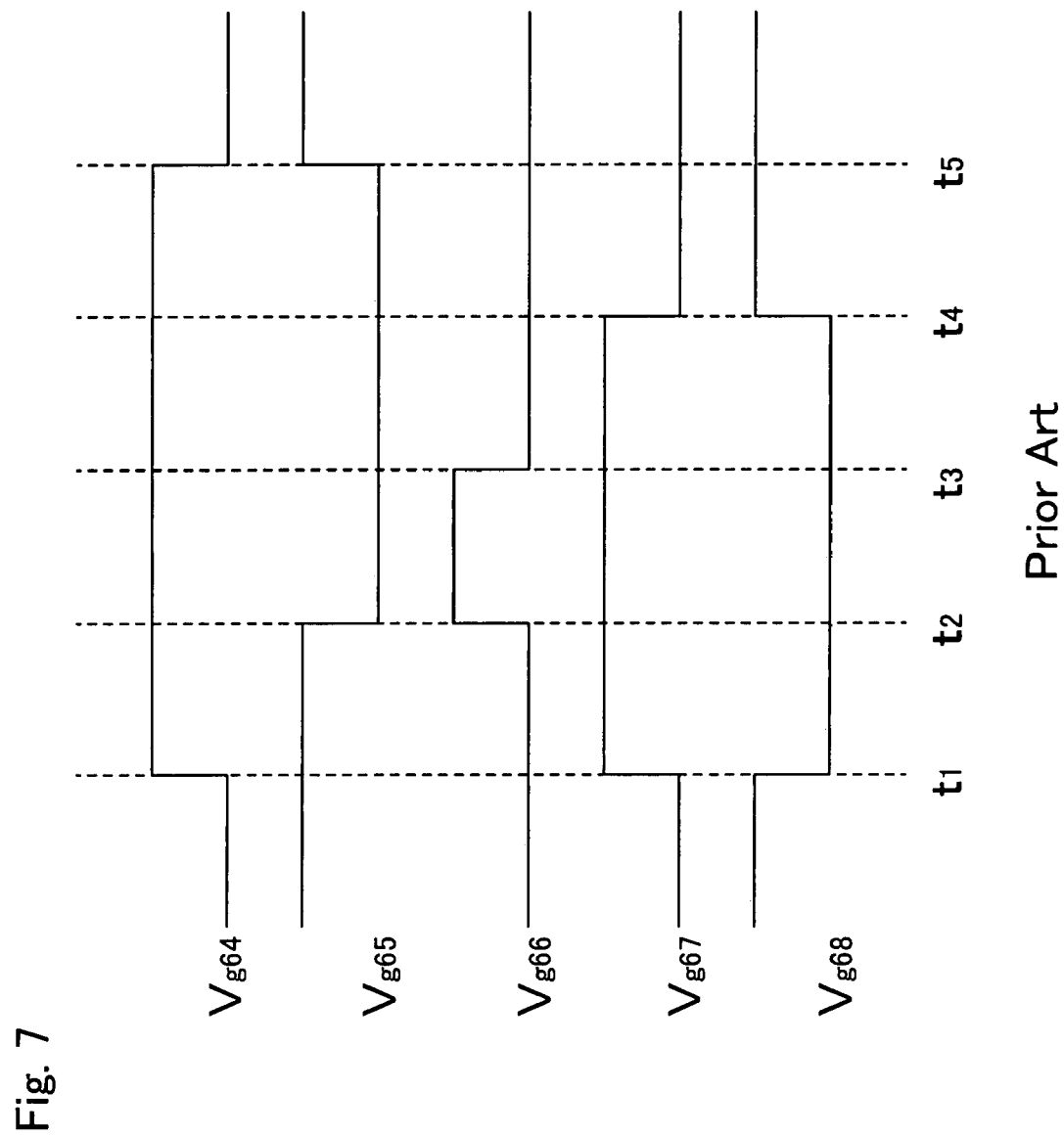
FIG. 7 is a diagram showing a timing chart of the conventional correction circuit-equipped analog buffer circuit.
Figure 8:
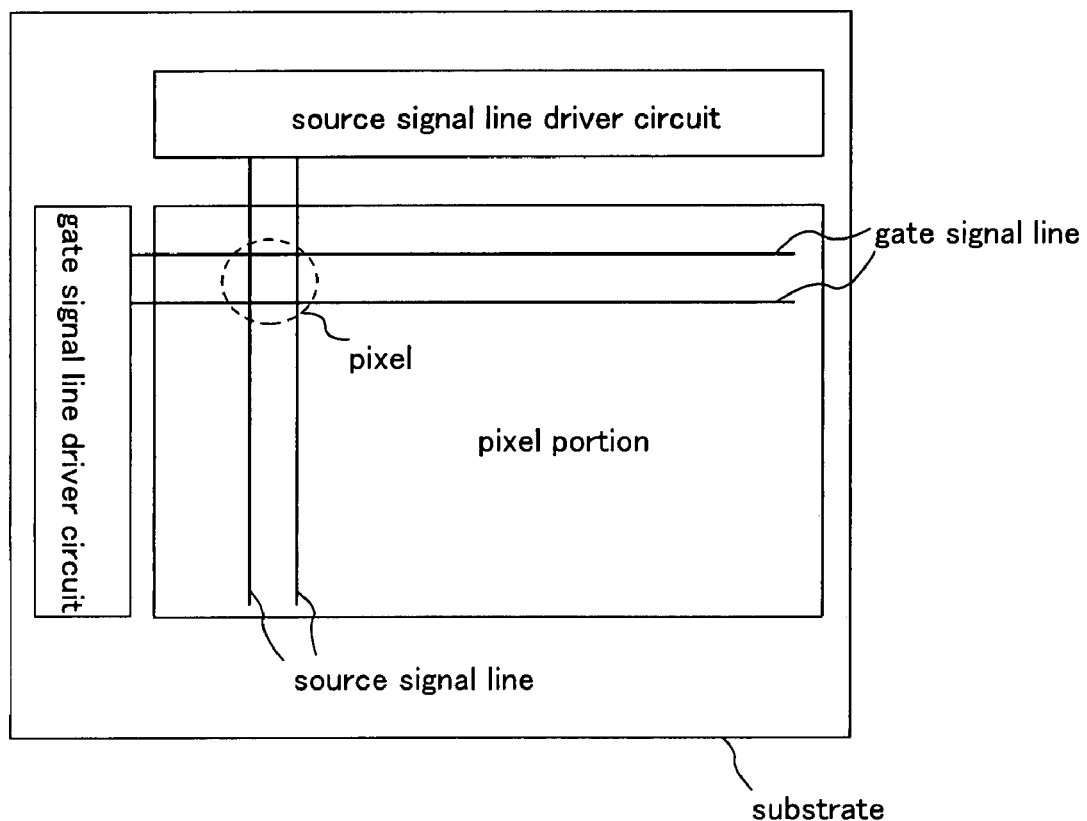
FIG. 8 is a block diagram of an active matrix display device.
Figure 9:
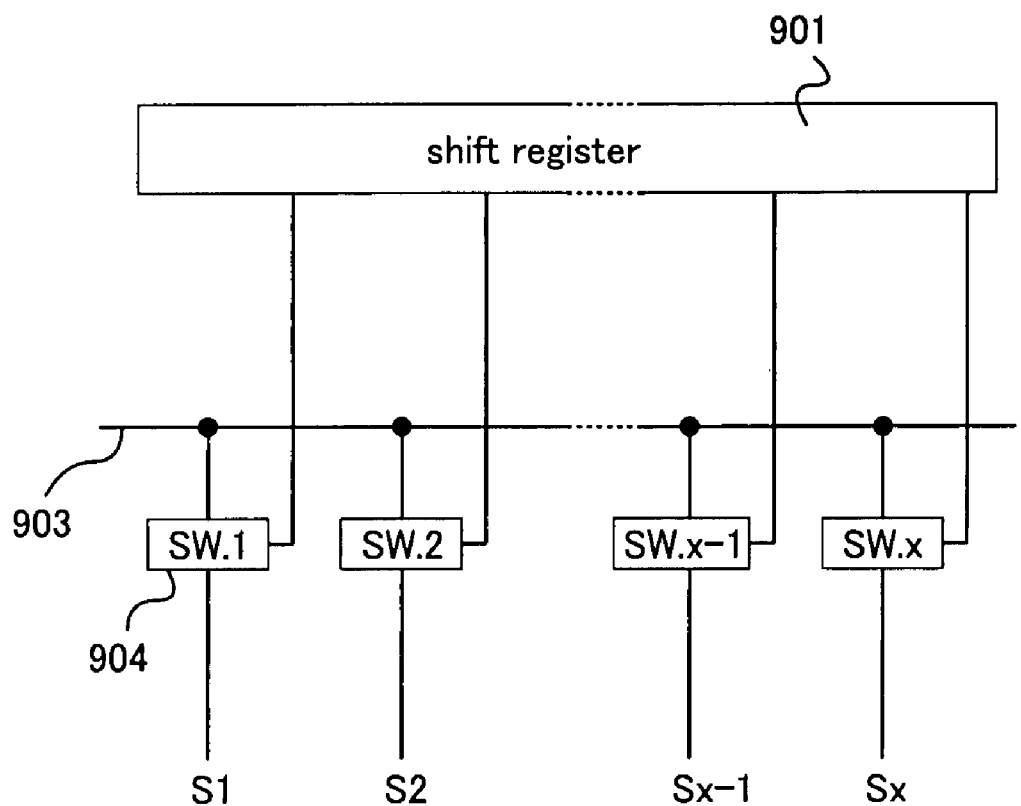
FIG. 9 is a diagram showing a structure of a source signal line driver circuit with point sequential drive.
Figure 10:
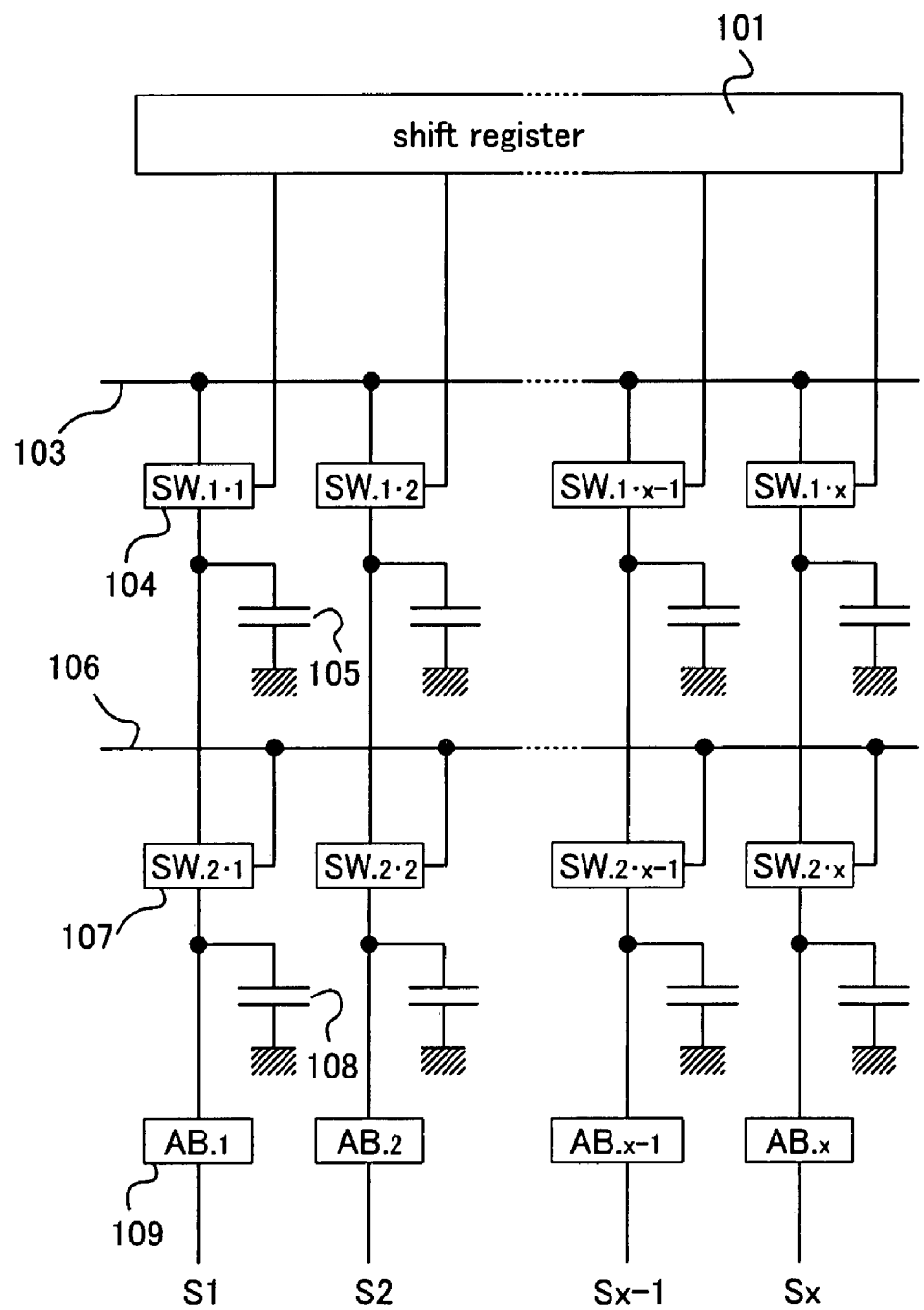
FIG. 10 is a diagram showing a structure of a source signal line driver circuit with line sequential drive.

A differential circuit 11 is composed of TFTs 1 and 2. A current mirror circuit 12 is composed of TFTs 3 and 4. A constant current source 13 is composed of a TFT 5. As compared with the structure of the conventional analog buffer circuit shown in FIG. 5, the respective TFTs in the differential circuit 11, the current mirror circuit 12, and the constant current source 13 are formed using a double gate TFT in FIG. 1.

The gate electrodes of the TFTs 3 and 4 are connected with each other. One of the source region and the drain region of the TFT 3 and one of the source region and the drain region of the TFT 14 are connected with a power source line Vdd. The other of the TFT 3 is connected with one of the source region and the drain region of the TFT 1. The other of the TFT 4 is connected with one of the source region and the drain region of the TFT 2. The source region or the drain region of the TFT 3, which is not connected with the power source line Vdd, is connected with the gate electrode thereof. One of the source region and the drain region of the TFT 2, which is connected with the TFT 4, is connected with the gate electrode of the TFT 2 and an output terminal for obtaining an output. The gate electrode of the TFT 1 is connected with an input terminal to which an input signal is inputted. One of the source region and the drain region of the TFT 5 is connected with the source region or the drain region of the TFT 1 which is not connected with the TFT 3, and the source region or the drain region of the TFT 2 which is not connected with the TFT 4. The other of the TFT 5 is grounded. A bias voltage is inputted to the gate electrode of the TFT 5.

Note that the TFTs 1 to 5 are not limited to the double gate type and may be multi-gate TFTs in which the number of gate lines is larger.

When such double gate type TFTs or the multi-gate TFTs in which the number of gate lines is larger is used, the characteristics of the channel regions are averaged and thus an element in which a characteristic variation is small is obtained. Also, the deterioration of the TFT due to a hot carrier can be suppressed.

Note that, in the drawing, an n-channel TFT is used as an element composing the differential circuit 11 and a p-channel TFT is used as an element composing the current mirror circuit 12. The present invention can be also applied to the case where a p-channel TFT is used as an element composing the differential circuit 11 and an n-channel TFT is used as an element composing the current mirror circuit 12.

The gate length and the gate width of the TFT composing the analog buffer circuit shown in FIG. 1 are to be set twice or more as compared with another TFT (this TFT is called a logic region TFT) composing a source signal line driver circuit into which the analog buffer circuit is incorporated.

Specifically, a gate length is set to be 7 μm or longer and a gate width is set to be 50 μm or longer.

With the above structure, an analog buffer circuit having a small variation is obtained.

Embodiment 2

Figure 2:
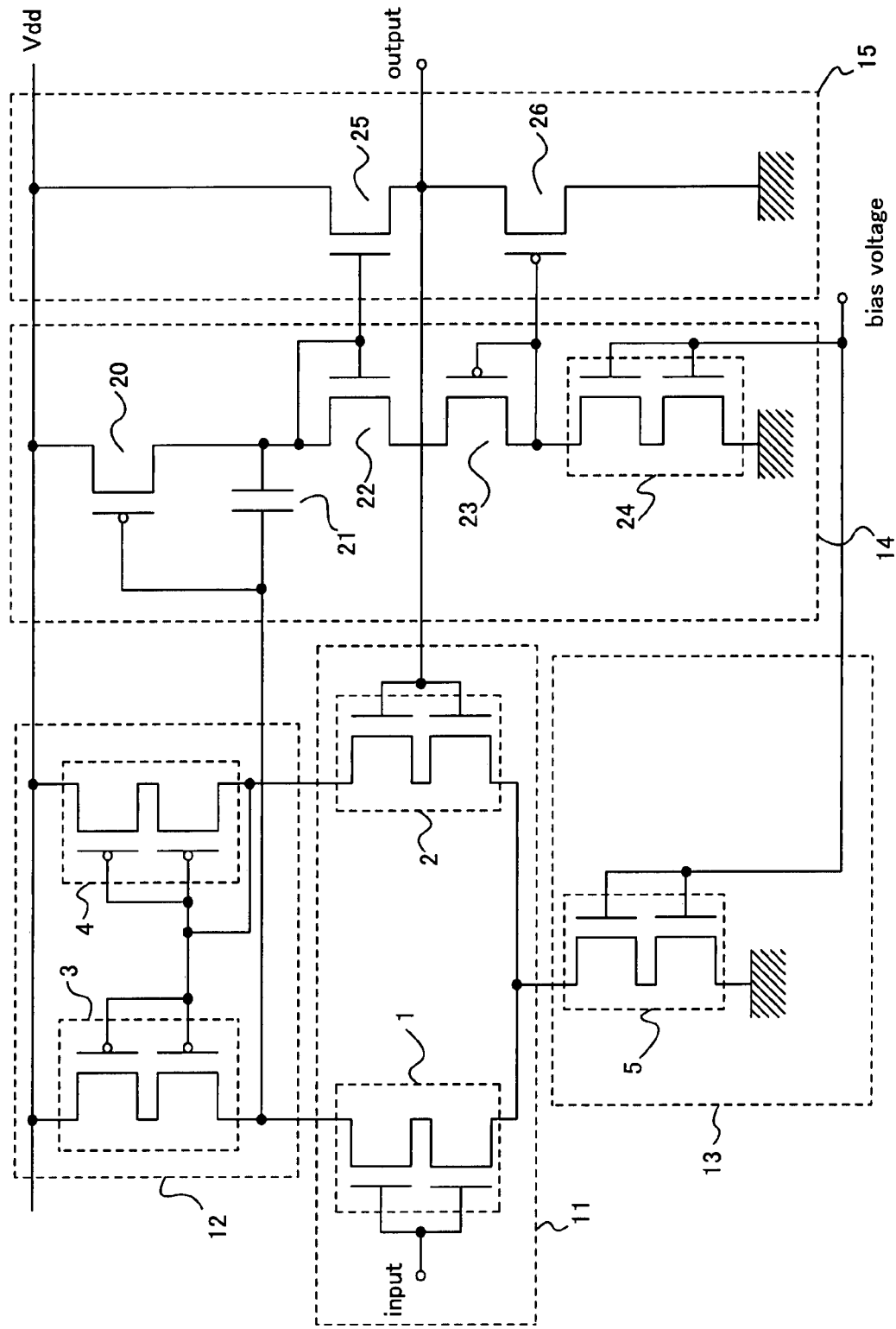
FIG. 2 is a circuit diagram of the analog buffer circuit of the present invention.

In this embodiment, an example of an analog buffer circuit having a structure which is different from Embodiment 1 is shown in FIG. 2. Note that the same portions as that in FIG. 1 are indicated by the same reference symbols and therefore the descriptions thereof are omitted here.

In an analog buffer circuit shown in FIG. 2, a first amplifying circuit 14 and a second amplifying circuit 15 are attached to the analog buffer circuit shown in FIG. 1.

The first amplifying circuit 14 is composed of TFTs 20, 22, 23, and 24 and a capacitor 21. The second amplifying circuit 15 is composed of TFTs 25 and 26.

The gate electrodes of the TFTs 3 and 4 are connected with each-other. One of the source region and the drain region of the TFT 3 and one of the source region and the drain region of the TFT 4 are connected with a power source line Vdd. The other of the TFT 3 is connected with one of the source region and the drain region of the TFT 1. The other of the TFT 4 is connected with one of the source region and the drain region of the TFT 2. The source region or the drain region of the TFT 4, which is not connected with the power source line Vdd, is connected with the gate electrode thereof. The source region or the drain region of the TFT 3, which is not connected with the power source line Vdd, is connected with the gate electrode of the TFT 20 and the capacitor 21. The gate electrode of the TFT 2, one of the source region and the drain region of the TFT 25, and one of the source region and the drain region of the TFT 26 are connected with one another, and connected with an output terminal for obtaining an output. The gate electrode of the TFT 1 is connected with an input terminal to which an input signal is inputted. One of the source region and the drain region of the TFT 5 is connected with the source region or the drain region of the TFT 1 which is not connected with the TFT 3, and the source region or the drain region of the TFT 2 which is not connected with the TFT 4. The other of the TFT 5 is grounded. A bias voltage is inputted to the gate electrode of the TFT 5. One of the source region and the drain region of the TFT 20 is connected with the power source line Vdd. The other of the TFT 20 is connected with one electrode of the capacitor 21, which is not connected with the TFTs 1 and 3, the source region or the drain region of the TFT 22, and the gate electrode thereof. The gate electrode of the TFT 22 is connected with the gate electrode of the TFT 25. The source region or the drain region of the TFT 22, which is not connected with the TFT 20, is connected with one of the source region and the drain region of the TFT 23. The source region or the drain region of the TFT 23, which is not connected with the TFT 22, is connected with the gate electrode of the TFT 23, one of the source region and the drain region of the TFT 24, and the gate electrode of the TFT 26. The source region or the drain region of the TFT 24, which is not connected with the TFT 23, is grounded. The bias voltage is inputted to the gate electrode of the TFT 24. The source region or the drain region of the TFT 25, which is connected with the TFT 2, is connected with one of the source region and the drain region of the TFT 26. The source region or the drain region of the TFT 25, which is not connected with the TFT 2, is connected with the power source line Vdd. The source region or the drain region of the TFT 26, which is not connected with the TFT 25, is grounded.

A part of the TFTs composing the circuit is the double gate type. Note that the multi-gate type TFT in which the number of gate lines is larger may be used.

When such double gate type TFTs or the multi-gate TFTs in which the number of gate lines is larger are used, the characteristics of the channel regions are averaged, and an element in which a characteristic variation is small is obtained. Also, the deterioration of the TFT due to a hot carrier can be suppressed.

Note that, in the drawing, an n-channel TFT is used as an element composing the differential circuit 11 and a p-channel TFT is used as an element composing the current mirror circuit 12. The present invention can be also applied to the case where a p-channel TFT is used as an element composing the differential circuit 11 and an n-channel TFT is used as an element composing the current mirror circuit 12.

The gate length and the gate width of the TFT composing the analog buffer circuit shown in FIG. 2 are set to be twice or more as compared with another TFT (this TFT is called a logic region TFT) composing a source signal line driver circuit into which the analog buffer circuit is incorporated.

Specifically, a gate length is set to be 7 µm or longer and a gate width is set to be 50 µm or longer.

With the above structure, an analog buffer circuit having a small variation is obtained.

Embodiment 3

In this embodiment, an example of an analog buffer circuit having a structure which is different from Embodiments 1 and 2 will be described with reference to FIG. 3.

Figure 3:
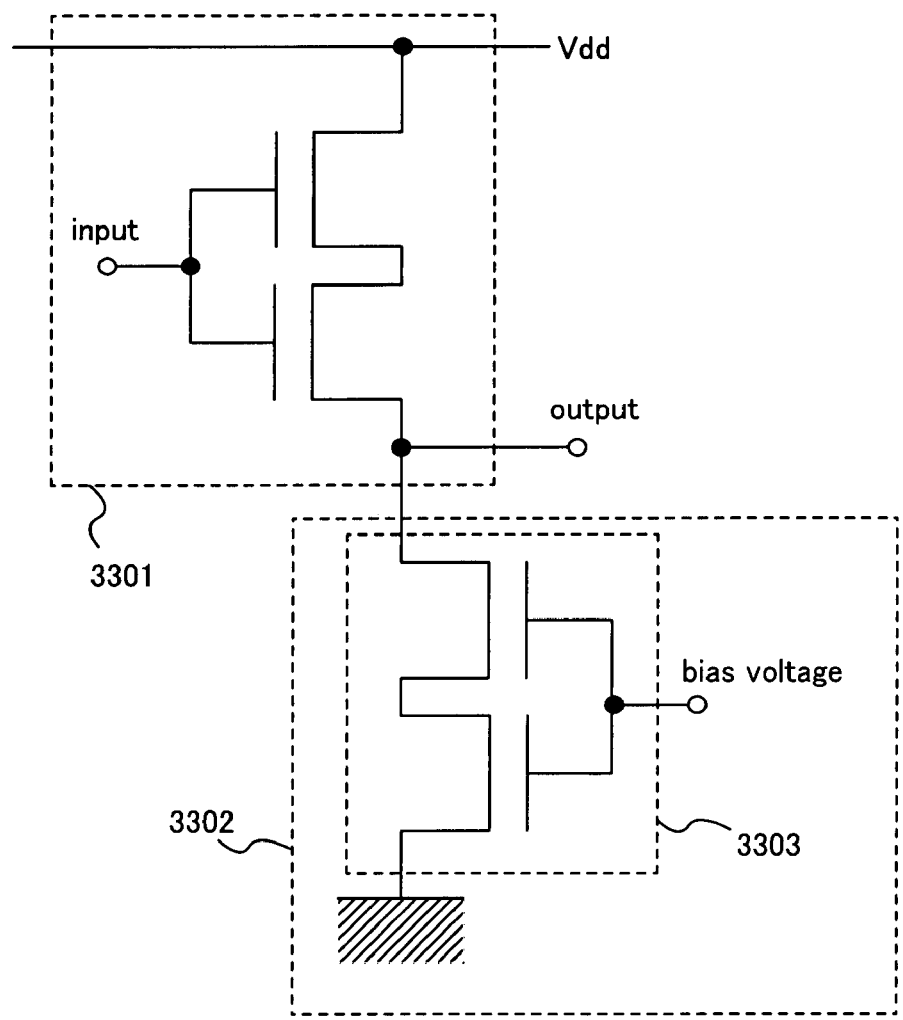
FIG. 3 is a circuit diagram of the analog buffer circuit of the present invention.

The analog buffer circuit shown in FIG. 3 is a source follower type composed of an amplification TFT 3301 and a constant current source 3302. The constant current source 3302 is composed of a TFT 3303.

A signal is inputted to the gate electrode of the amplification TFT 3301. One of the source region and the drain region of the amplification TFT 3301 is connected with a power source line Vdd. The other of the amplification TFT 3301 is connected with one of the source region or the drain region of the TFT 3303, and thus an output is obtained. The other of the TFT 3303, which is not connected with the TFT 3301, is grounded. A bias voltage is inputted to the gate electrode of the TFT 3303.

The amplification TFT 3301 and the TFT 3303 composing the constant current source 3302 have a double gate structure. Note that the present invention is not limited to the double gate structure and a multi-gate structure in which the number of gate lines is larger may be used.

By using such double gate type TFTs or multi-gate TFTs in which the number of gate lines is larger, the characteristics of the channel regions are averaged, and thus an element in which a characteristic variation is small is obtained. Also, the deterioration of the TFT due to a hot carrier can be suppressed.

The gate length and the gate width of the TFT composing the analog buffer circuit shown in FIG. 3 are set to be twice or more as compared with another TFT (logic region TFT) composing a source signal line driver circuit into which the analog buffer circuit is incorporated.

Specifically, a gate length is set to be 7 µm or longer and a gate width is set to be 50 µm or longer.

With the above structure, an analog buffer circuit having a small variation is obtained.

In this embodiment, the thin film transistors constituting the source follower type may be contacted in parallel each other.

Embodiment 4

In this embodiment, an example of an analog buffer circuit having a structure which is different from the structures described in Embodiments 1 to 3 will be described with reference to FIG. 12.

The analog buffer circuit is constructed of differential circuits 121 and 123, current mirror circuits 122 and 124, and a constant current source 125.

Figure 12:
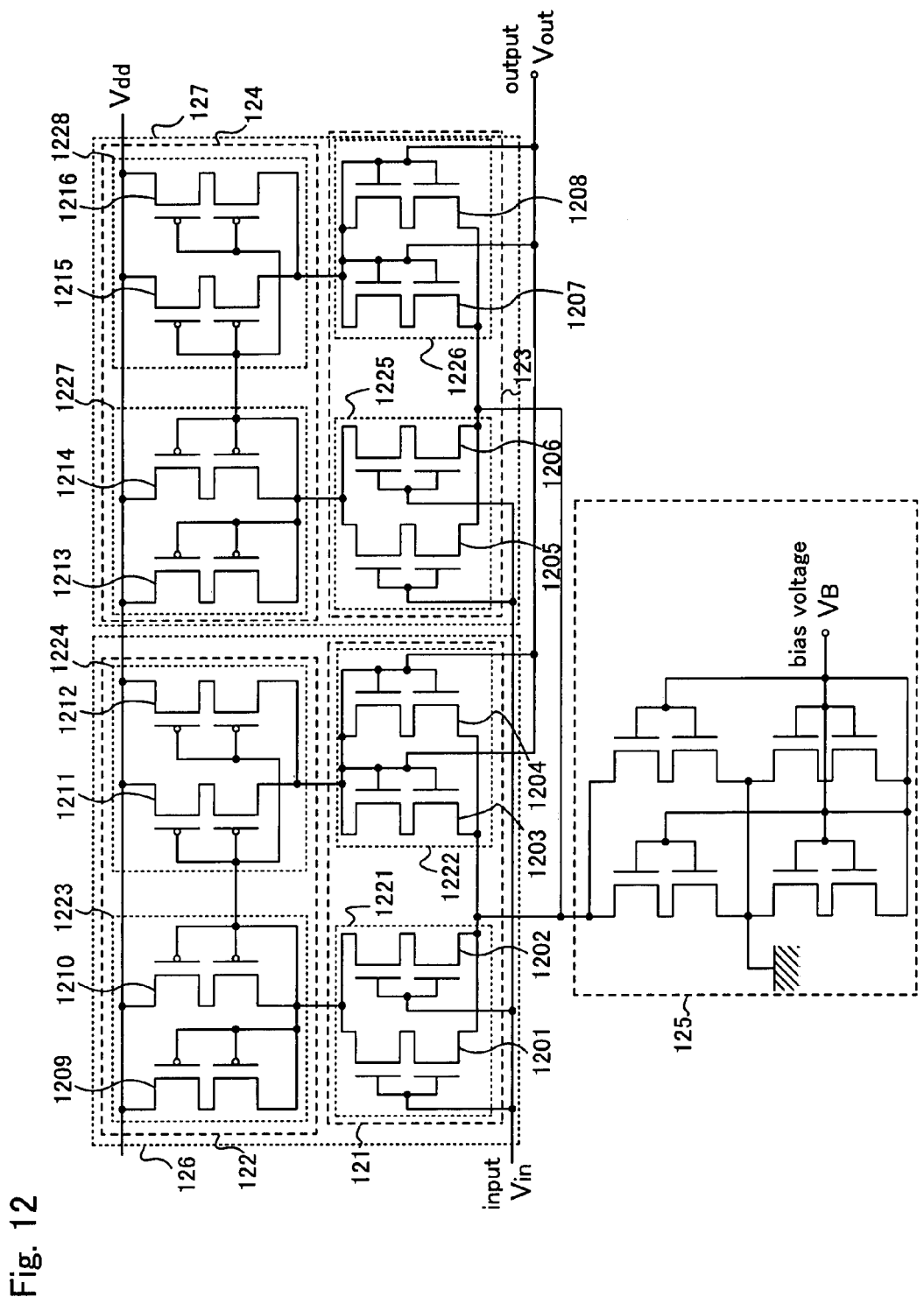
FIG. 12 is a circuit diagram of an analog buffer circuit of the present invention.

In FIG. 12, the TFT composing the circuit is the double gate type. Note that the present invention is not limited to the double gate structure and the multi-gate structure in which the number of gate lines is larger may be used.

By using such double gate type TFTs or the multi-gate TFTs in which the number of gate lines is larger, the characteristics of the channel regions are averaged, and thus an element in which a characteristic variation is small is obtained. Also, the deterioration of the TFT due to a hot carrier can be suppressed.

The gate length and the gate width of the TFT composing the analog buffer circuit shown in FIG. 12 are set to be twice or more as compared with another TFT (logic region TFT) composing the source signal line driver circuit into which the analog buffer circuit is incorporated.

Specifically, a gate length is set to be 7 µm or longer and a gate width is set to be 50 µm or longer.

Also, in the differential circuits 121 and 123 and the current mirror circuits 122 and 124, a pair of TFTs 1201 and 1202, a pair of TFTs 1203 and 1204, a pair of TFTs 1205 and 1206, a pair of TFTs 1207 and 1208, a pair of TFTs 1209 and 1210, a pair of TFTs 1211 and 1212, a pair of TFTs 1213 and 1214, and a pair of TFTs 1215 and 1216 are connected in parallel and used as sets of TFTs 1221, 1222, 1225, 1226, 1223, 1224, 1227, and 1228, respectively.

With the above structure, since the circuit can be operated based on the average characteristic of two TFTs, a circuit having a small variation as a whole can be obtained.

Two sets of differential circuits and current mirror circuits (126 and 127) are connected in parallel to be used. Thus, a variation in the analog buffer circuit can be further reduced.

Figure 13:
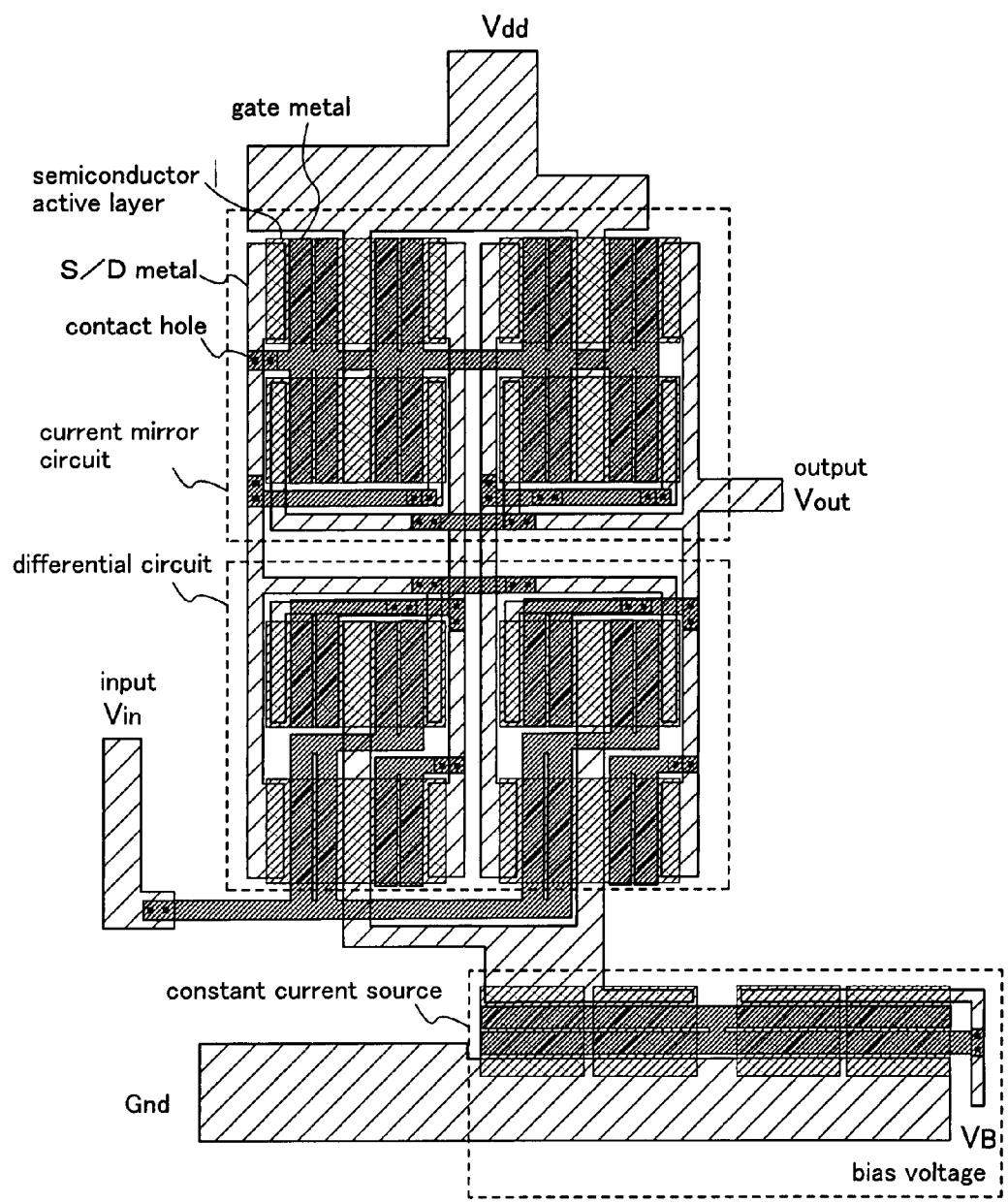
FIG. 13 is a plan view of the analog buffer circuit of the present invention.

An example of an arrangement of TFTs in the case where the circuit shown in FIG. 12 is actually manufactured is shown in FIG. 13.

This is an example in the case where a substrate in which a polycrystalline semiconductor layer is formed is observed from the above surface.

In FIG. 13, as described in the above embodiment modes, it is structured such that a plurality of TFTs for which the identical characteristic is desired are connected in parallel and the arrangement of the channel regions of the plurality of TFTs is devised. Thus, a characteristic variation of the TFTs due to position dependence of crystallinity of the polycrystalline semiconductor film is suppressed.

Figure 17:
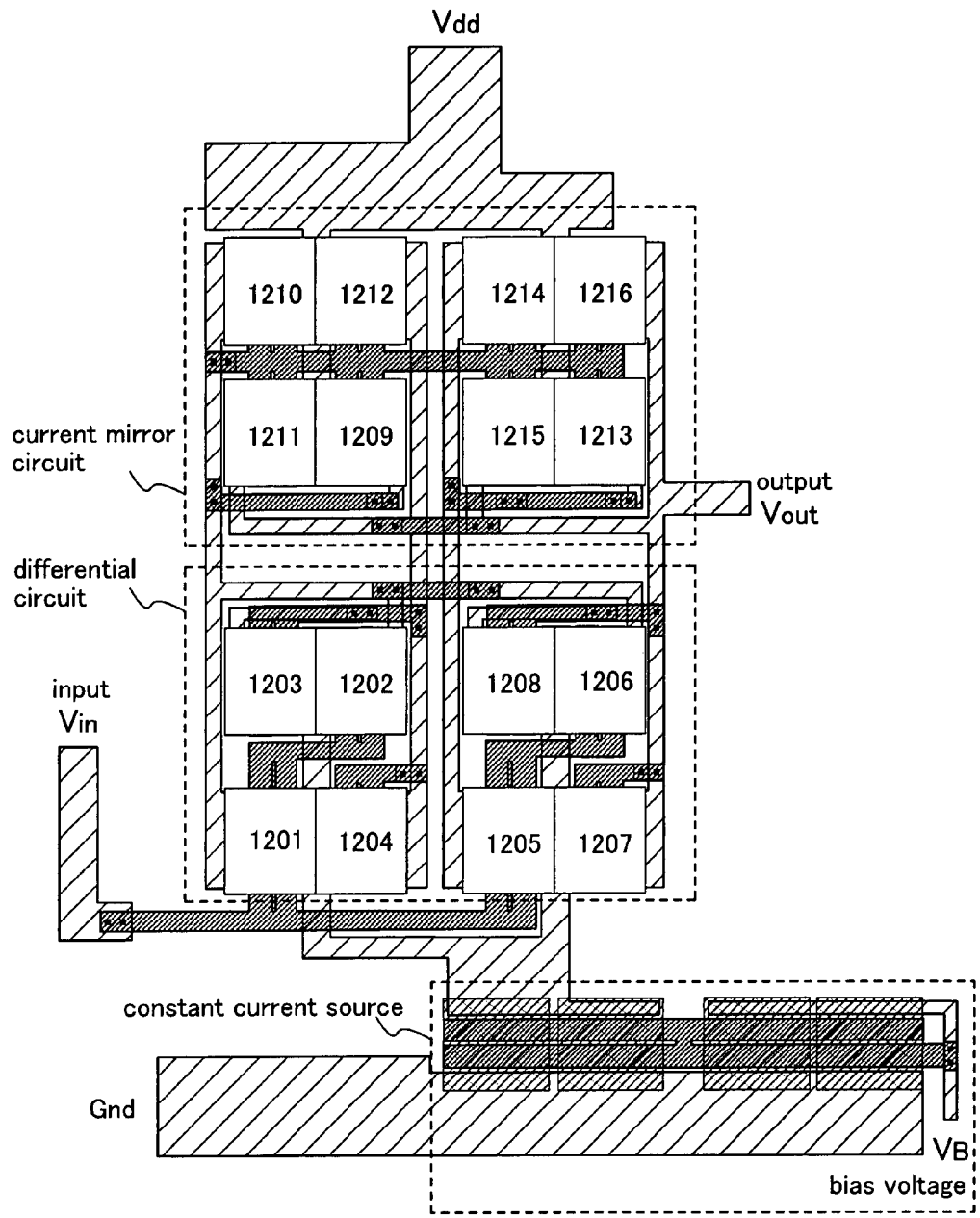
FIG. 17 is a plan view showing the arrangement of TFTs of the analog buffer circuit of the present invention.
Figure 18:
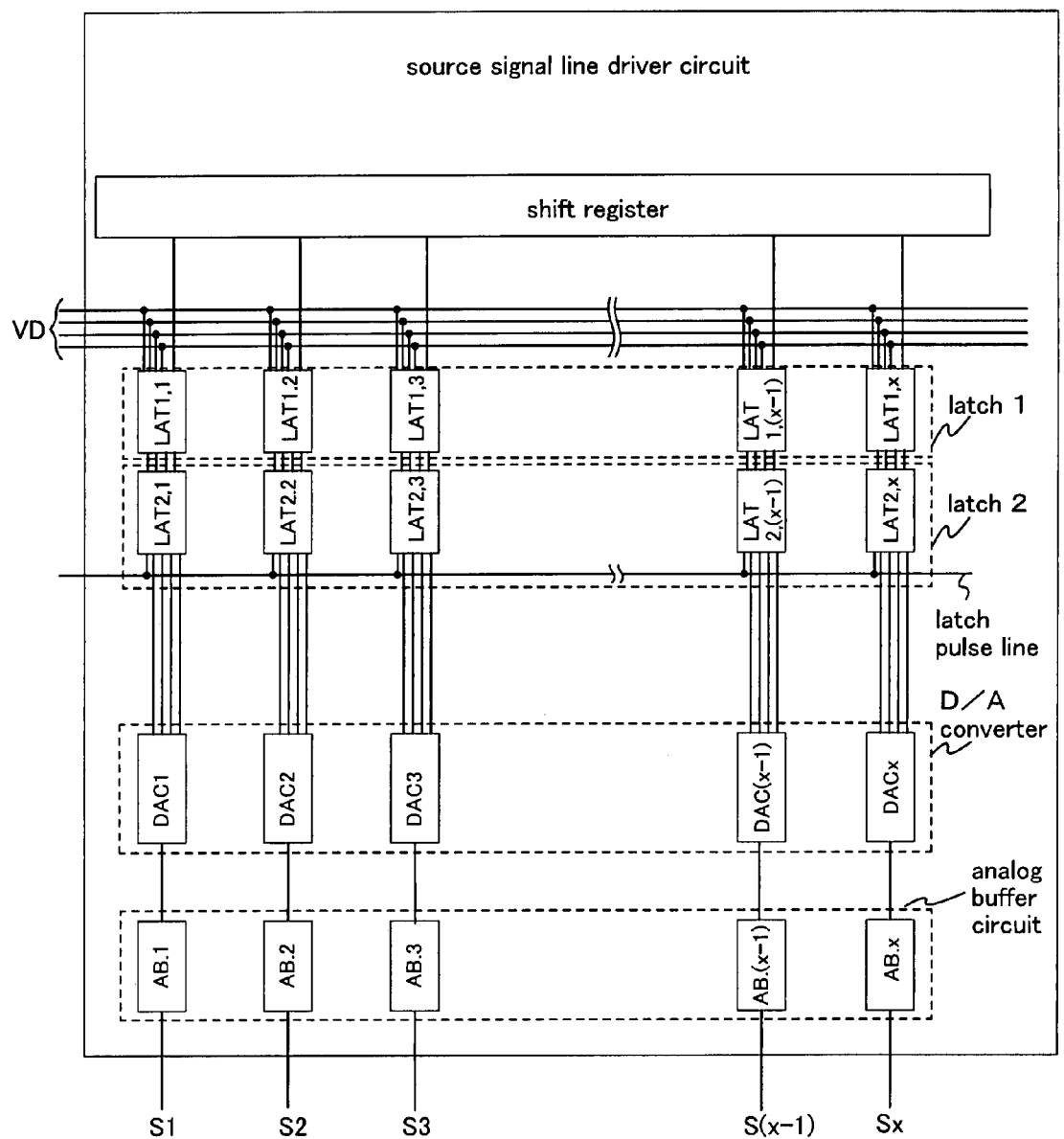
FIG. 18 is a diagram showing a structure of the source signal line driver circuit with line sequential drive.

Here, for ease in understanding, an arrangement in the case where the arrangement of the TFTs in FIG. 13 is indicated using the reference symbols in FIG. 12 is shown in FIG. 17.

A comparison between FIGS. 12 and 17 are made. Here, two sets of TFTs 1221 and 1222 for which the identical characteristic is required will be noted and described in FIG. 12.

The TFTs 1201 and 1202 composing the set of TFTs 1221 are located symmetrically about a point with respect to a symmetrical center. On the other hand, the TFTs 1203 and 1204 composing another set of TFTs 1222 are located symmetrically about a point with respect to a symmetrical center. Symmetrical centers in these two sets of TFTs coincide. Thus, two sets of TFTs having identical characteristics are obtained. With regard to the other sets of TFTs, namely, two sets of TFTs 1223 and 1224, two sets of TFTs 1225 and 1226, and two sets of TFTs 1227 and 1228, identical arrangements are also made.

Two sets of TFTs composing the differential circuit have been described. With regard to two sets of TFTs composing the current mirror circuit, identical arrangements are also made.

Therefore, the channel regions of the TFTs are located in the so-called cross arrangement, and thus an analog buffer circuit having a small variation is obtained.

A characteristic of the analog buffer circuit having the above structure is shown in FIGS. 20A to 20D.

FIG. 20A is a graph showing a characteristic of an output voltage Vhd out an input voltage $V_{in}$ in the analog buffer circuit.

FIG. 20B is a graph indicating a value of the output voltage $V_{out}$ to the input voltage $V_{in}$ of 4.0 V in the analog buffer circuit. It shows the result with respect to 40 measurement points.

FIG. 20C is a graph indicating a value of the output voltage $V_{out}$ to the input voltage $V_{in}$ of 8.0 V in the analog buffer circuit. It shows the result with respect to 40 measurement points.

FIG. 20D is a graph indicating a value of the output voltage $V_{out}$ to the input voltage $V_{in}$ of 12.0 V in the analog buffer circuit. It shows the result with respect to 40 measurement points.

In the analog buffer circuit using the polycrystalline TFTs, a variation in the output voltage can be made to be 50 mV or lower.

Based on the above structure, the analog buffer circuit having a small variation is obtained.

Embodiment 5

In Embodiment 5, a method of manufacturing an EL display device as a semiconductor device having an analog buffer circuit of the present invention is described. A method of manufacturing a pixel portion on the same substrate and the TFT of the driver circuit (typically the n-channel type TFT and the p-channel type TFT) on the periphery of the pixel portion simultaneously is described in detail using FIGS. 21 to 24.

First, in this embodiment, a substrate 300 is used, which is made of glass such as barium borosilicate glass or alumino borosilicate glass, typified by #7059 glass or #1737 glass of Corning Inc. There is no limitation on the substrate 300 as long as a substrate having a light transmitting property is used, and a quartz substrate may also be used. In addition, a plastic substrate having heat resistance to a treatment temperature of this embodiment may also be used.

Then, a base film 301 formed of an insulating film such, as a silicon oxide film, a silicon nitride film or a silicon oxynitride film is formed on the substrate 300. In this embodiment, a two-layer structure is used for the base film 301. However, a single layer film or a lamination structure consisting of two or more layers of the insulating film may also be used. As a first layer of the base film 301, a silicon oxynitride film 301a is formed with a thickness of 10 to 200 nm (preferably 50 to 100 nm) using $SiH_4$, $NH_3$, and $N_2O$ as reaction gases by a plasma CVD method. In this embodiment, the silicon oxynitride film 301a (composition ratio Si=32%, O=27%, N=24% and H=17%) having a film thickness of 50 nm is formed. Then, as a second layer of the base film 301, a silicon oxynitride film 301b is formed so as to be laminated as a second layer of the base film 301 with a thickness of 50 to 200 nm (preferably 100 to 150 nm) using $SiH_4$ and $N_2O$ as reaction gases by the plasma CVD method. In this embodiment, the silicon oxynitride film 301b (composition ratio Si=32%, O=59%, N=7% and H=2%) having a film thickness of 100 nm is formed.

Subsequently, semiconductor layers 302 to 305, 381 are formed on the base film. The semiconductor layers 302 to 305, 381 are formed such that a semiconductor film having an amorphous structure is formed by a known method (a sputtering method, an LPCVD method, a plasma CVD method or the like), and is subjected to a known crystallization process (a laser crystallization method, a thermal crystallization method, a thermal crystallization method using a catalyst such as nickel, or the like) to obtain a crystalline semiconductor film, and the crystalline semiconductor film is patterned into desired shapes. The semiconductor layers 302 to 305, 381 are formed with a thickness of 25 to 80 nm (preferably 30 to 60 nm). The material of the crystalline semiconductor film is not particularly limited, but it is preferable to form the film using silicon, a silicon germanium ($Si_xGe_{1-x}$ (X=0.0001 to 0.02)) alloy, or the like. In this embodiment, an amorphous silicon film of 55 nm thickness is formed by a plasma CVD method, and then, a nickel-containing solution is held on the amorphous silicon film. A dehydrogenation process of the amorphous silicon film is performed (at 500° C. for 1 hour), and thereafter a thermal crystallization process is performed (at 550° C. for 4 hours) thereto. Further, to improve the crystallinity, a laser annealing process is performed to form the crystalline silicon film. Then, this crystalline silicon film is subjected to a patterning process using a photolithography method to obtain the semiconductor layers 302 to 305, 381.

Further, after the formation of the semiconductor layers 302 to 305, 381, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or $YVO_4$ laser may be used. In the case where those lasers are used, it is appropriate to use a method in which laser light radiated from a laser oscillator is condensed into a linear shape by an optical system, and is irradiated to the semiconductor film. Although the conditions of crystallization should be properly selected by an operator, in the case where the excimer laser is used, a pulse oscillation frequency is set to 30 Hz, and a laser energy density is set to 100 to 400 mJ/cm$^2$ (typically 200 to 300 mJ/cm$^2$). In the case where the YAG laser is used, it is appropriate to set a pulse oscillation frequency as 1 to 10 kHz using the second harmonic, and to set a laser energy density to 300 to 600 mJ/cM$^2$ (typically, 350 to 500 mJ/cm$^2$). Then, laser light condensed into a linear shape with a width of 100 to 1000 μm, for example, 400 μm, is irradiated to the whole surface of the substrate, and an overlapping ratio (overlap ratio) of the linear laser light at this time may be set to 50 to 90%.

A gate insulating film 306 is then formed for covering the semiconductor layers 302 to 305, and 381. The gate insulating film 306 is formed of an insulating film containing silicon with a thickness of 40 to 150 nm by a plasma CVD or sputtering method. In this embodiment, the gate insulating film 306 is formed of a silicon oxynitride film with a thickness of 110 nm by the plasma CVD method (composition ratio Si=32%, O=59%, N=7%, and H=2%). Of course, the gate insulating film is not limited to the silicon oxynitride film, and other insulating films containing silicon may be used with a single layer or a lamination structure.

Besides, when a silicon oxide film is used, it can be formed such that TEOS (tetraethyl orthosilicate) and O$_2$ are mixed by the plasma CVD method with a reaction pressure of 40 Pa and a substrate temperature of 300 to 400° C., and discharged at a high frequency (13.56 MHz) power density of 0.5 to 0.8 W/cm$^2$. The silicon oxide film thus manufactured can obtain satisfactory characteristics as the gate insulating film by subsequent thermal annealing at 400 to 500° C.

Then as shown in FIG. 21A, a first conductive film 307 of 20 to 100 nm thickness and a second conductive film 308 of 100 to 400 nm thickness are formed into lamination on the gate insulating film 306. In this embodiment, the first conductive film 307 made of a TaN film with a thickness of 30 nm and the second conductive film 308 made of a W film with a thickness of 370 nm are formed into lamination. The TaN film is formed by sputtering with a Ta target under a nitrogen containing atmosphere. Besides, the W film is formed by sputtering with a W target. The W film may also be formed by a thermal CVD method using tungsten hexafluoride (WF$_6$). Whichever method is used, it is necessary to make the material have low resistance for use as a gate electrode, and it is preferred that the resistivity of the W film is set to 20 μΩcm or less. It is possible to make the W film have low resistance by making the crystal grains large. However, in the case where many impurity elements such as oxygen are contained within the W film, crystallization-is inhibited and the resistance becomes higher. Therefore, in this embodiment, the W film is formed by sputtering using a W target having a high purity of 99.9999%, and also by taking sufficient consideration so as to prevent impurities within the gas phase from mixing therein during the film formation, and thus, a resistivity of 9 to 20 μΩcm can be realized.

Note that, in this embodiment, the first conductive film 307 is made of TaN, and the second conductive film 308 is made of W, but the material is not particularly limited thereto, and either film may be formed from an element selected from the group consisting of Ta, W, Ti, Mo, Al, Cu, Cr, and Nd or an alloy material or a compound material containing the above element as its main constituent. Besides, a semiconductor film typified by a polycrystalline silicon film doped with an impurity element such as phosphorus may be used. An alloy made of Ag, Pd, and Cu may also be used. Further, any combination may be employed such as a combination in which the first conductive film is formed of a tantalum (Ta) film and the second conductive film is formed of a W film, a combination in which the first conductive film is formed of a titanium nitride (TiN) film and the second conductive film is formed of a W film, a combination in which the first conductive film is formed of a tantalum nitride (TaN) film and the second conductive film is formed of an Al film, or a combination in which the first conductive film is formed of a tantalum nitride (TaN) film and the second conductive film is formed of a Cu film.

Next, as shown in. FIG. 21B, masks 309 to 313 made of resist are formed by using a photolithography method, and a first etching process for forming electrodes and wirings is carried out. In the first etching process, first and second etching conditions are used. In this embodiment, as the first etching condition, an ICP (inductively coupled plasma) etching method is used, in which CF$_4$, Cl$_2$, and O$_2$ are used as etching gases, a gas flow rate is set to 25/25/10 sccm, and an RF (13.56 MHz) power of 500 W is applied to a coil shape electrode under a pressure of 1 Pa to generate plasma. Thus, the etching is performed. A dry etching device using ICP (Model E645-ICP) manufactured by Matsushita Electric Industrial Co. is used here. A 150 W RF (13.56 MHz) power is also applied to the substrate side (sample stage), thereby substantially applying a negative self-bias voltage. The W film is etched under the first etching condition, and the end portion of the first conductive layer is formed into a tapered shape. In the first etching condition, the etching rate for W is 200.39 nm/min, the etching rate for TaN is 80.32nm/min, and the selectivity of W to TaN is about 2.5. Further, the taper angle of W is about 26° under the first etching condition.

Thereafter, as shown in FIG. 21B, the etching condition is changed into the second etching condition without removing the masks 309 to 313 made of resist, and the etching is performed for about 30 seconds, in which CF$_4$ and Cl$_2$ are used as the etching gases, a gas flow rate is set to 30/30 sccm, and an RF (13.56 MHz) power of 500 W is applied to a coil shape electrode under a pressure of 1 Pa to generate plasma. An RF (13.56 MHz) power of 20 W is also applied to the substrate side (sample stage), and a substantially negative self-bias voltage is applied thereto. In the second etching condition in which CF$_4$ and Cl$_2$ are mixed, the W film and the TaN film are etched to the same degree. In the second etching condition, the etching rate for W is 58.97 nm/min, and the etching rate for TaN is 66.43 nm/min. Note that, in order to perform the etching without leaving any residue on the gate insulating film, it is appropriate that an etching time is increased by approximately 10 to 20%.

In the above first etching process, by making the shapes of the masks formed of resist suitable, end portions of the first conductive layer and the second conductive layer become tapered shape by the effect of the bias voltage applied to the substrate side. The angle of the taper portion may be 15° to 45°. In this way, first shape conductive layers 314 to 318 consisting of the first conductive layer and the second conductive layer (first conductive layers 314a to 318a and second conductive layers 314b to 318b) are formed by the first etching process. Reference numeral 319 indicates a gate insulating film, and the regions not covered with the first shape conductive layers 314 to 318 are made thinner by approximately 20 to 50 nm by etching.

Then, a first doping process is performed to add an impurity element imparting n-type conductivity to the semiconductor layer without removing the masks made of resist (FIG. 21B). Doping may be carried out by an ion doping method or an ion injecting method. The condition of the ion doping method is that a dosage is $1\times10^{13}$ to $5\times10^{15}$ atoms/cm$^3$, and an acceleration voltage is 60 to 100 keV. In this embodiment, the dosage is $1.5\times10^{15}$ atoms/cm$^3$ and the acceleration voltage is 80 keV. As the impurity element imparting n-type conductivity, an element belonging to group 15 of the periodic table, typically phosphorus (P) or arsenic (As) is used, but phosphorus (P) is used here. In this case, the conductive layers 314 to 318 become masks: for the impurity element imparting n-type conductivity, and high concentration impurity regions 320 to 323, and 382 are formed in a self-aligning manner. The impurity element imparting n-type conductivity in a concentration range of $1\times10^{20}$ to $1\times10^{21}$ atoms/cm$^3$ is added to the high concentration impurity regions 320 to 323, and 382.

Thereafter, as shown in FIG. 21C, a second etching process is performed without removing the masks made of resist. Here, a gas mixture of $CF_4$, $Cl_2$ and $O_2$ is used as an etching gas, the gas flow rate is set to 20/20/20 sccm, and a 500 W RF (13.56 MHz) power is applied to a coil shape electrode under a pressure of 1 Pa to generate plasma, thereby performing etching. A 20 W RF (13.56 MHz) power is also applied to the substrate side (sample stage), thereby substantially applying a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° by the second etching process. Second conductive layers 324b to 328b are formed by the second etching process. On the other hand, the first conductive layers 314a to 318a are hardly etched so that the shape of first conductive layers 324a to 328a is as same as that of first conductive layers 314a to 318a.

Next, a second doping process is performed as shown in FIG. 22A. The second conductive layers 324b to 328b are used as masks for an impurity element, and doping is performed such that the impurity element is added to the semiconductor layer below the tapered portions of the first conductive layers 324a to 328a. In this embodiment, phosphorus (P) is used as the impurity element, and plasma doping is performed with a dosage of $1.5\times10^{14}$ atoms/cm$^2$, a current density of 0.5 µA, and an acceleration voltage of 90 keV. Thus, low concentration impurity regions 329 to 332, which overlap with the first conductive layers, are formed in self-aligning manner. The concentration of phosphorus (P) added to the low concentration impurity regions 329 to 332 is $1\times10^{17}$ to $5\times10^{18}$ atoms/cm$^3$, and has a gentle concentration gradient in accordance with the film thickness of the tapered portions of the first conductive layers. Note that in the semiconductor layers that overlap with the tapered portions of the first conductive layers, the concentration of the impurity element slightly falls from the end portions of the tapered portions of the first conductive layers toward the inner portions, but the concentration keeps almost the same level. Further, an impurity element is added to the high concentration impurity regions 320 to 323, and 382 and the high concentration impurity regions 333 to 337 are formed.

Thereafter, as shown in FIG. 22B, after the masks made of resist are removed, a third etching process is performed using a photolithography method. The tapered portions of the first conductive layers are partially etched so as to have shapes overlapping the second conductive layers in the third etching process. Incidentally mask made of resist (338, 339) are formed in the regions where the third etching process is not conducted as shown in FIG. 22B.

The etching condition in the third etching process is that $Cl_2$ and $SF_6$ are used as etching gases, the gas flow rate is set to 10/50 sccm, respectively, and the ICP etching method is used as in the first and second etching processes. Note that, in the third etching process, the etching rate for TaN is 111.2 nm/min, and the etching rate for the gate insulating film is 12.8 nm/min.

In this embodiment, a 500 W RF (13.56 MHz) power is applied to a coil shape electrode under a pressure of 1.3 Pa to generate plasma, thereby performing etching. A 10 W RF (13.56 MHz) power is also applied to the substrate side (sample stage), thereby substantially applying a negative self-bias voltage. Thus, first conductive layers 340a to 342a are formed.

Impurity regions (LDD regions) 343 to 345, which do not overlap with the first conductive layers 340a to 342a, are formed by the above third etching process. Note that impurity region (GOLD regions) 346 and 347 remain overlapping with the first conductive layers 324a and 326a.

Further, the electrode constituted of the first conductive layer 324a and the second conductive layer 324b finally becomes the gate electrode of the n-channel TFT of the driver circuit, and the electrode constituted of the first conductive layer 340a and a second conductive layer 340b finally becomes the gate electrode of the p-channel TFT of the driver circuit.

Similarly, the electrode constituted of the first conductive layer 341a and a second conductive layer 341b finally becomes the gate electrode of the n-channel TFT of the pixel portion, and the electrode constituted of the first conductive layer 342a and a second conductive layer 342b finally becomes the gate electrode of the p-channel TFT of the pixel portion. Moreover, the electrode constituted of the first conductive layer 326a and the second conductive layer 326b finally, becomes the other electrode of the capacitor of the pixel portion.

In this way, in this embodiment, the impurity regions (LDD regions) 343 to 345 that do not overlap with the first conductive layers 340a to 342a and the impurity regions (GOLD regions) 346 and 347 that overlap with the first conductive layers 324a to 326a can be simultaneously formed. Thus, different impurity regions can be formed in accordance with the TFT characteristics.

Next, after the masks 338 and 339 made of resist are removed, the gate insulating film 319 is subjected to an etching process. In this etching process, $CHF_3$ is used as an etching gas, and a reactive ion etching method (RIE method) is used. In this embodiment, a third etching process is conducted with a chamber pressure of 6.7 Pa, RF power of 800 W, and a gas flow rate of $CHF_3$ of 35 sccm.

Thus, the portion of the high concentration impurity regions 333 to 337 is exposed, and the insulating films 356a to 356e are formed.

Subsequently, masks 348, 349 made of resist is newly formed to thereby perform a third doping process. By this third doping process, impurity regions 350 to 355 added with an impurity element imparting conductivity (p-type) opposite to the above conductivity (n-type) are formed in the semiconductor layers that become active layers of the p-channel TFT (FIG. 22C). The first conductive layers 340a, 326a and 342a are used as masks for the impurity element, and the impurity element imparting p-type conductivity is added to form the impurity regions in a self-aligning manner.

In this embodiment, the impurity regions 350 to 355 are formed by an ion doping method using diborane ($B_2H_6$). Note that, in the third doping process, the semiconductor layers forming the n-channel TFTs are covered with the masks 348, 349 made of resist. The impurity regions 350 to 355 are respectively added with phosphorous at different concentrations by the first doping process and the second doping process. In any of the regions, the doping process is conducted such that the concentration of the impurity element imparting p-type conductivity becomes $2 \times 10^{20}$ to $2 \times 10^{21}$ atoms/cm$^3$. Thus, the impurity regions function as source and drain regions of the p-channel TFT, and therefore, no problem occurs.

Through the above-described processes, the impurity regions are formed in the respective semiconductor layers.

Note that, in this embodiment, a method of conducting doping of the impurities (boron) after etching the gate insulating film is shown, but doping of the impurities may be conducted before etching the gate insulating film.

Subsequently, the masks 348, 349 made of resist are removed, and as shown in FIG. 23A, a first interlayer insulating film 357 is formed. As the first interlayer insulating film 357, an insulating film containing silicon is formed with a thickness of 100 to 200 nm by a plasma CVD method or a sputtering method. In this embodiment, a silicon oxynitride film of 150 nm thickness is formed by the plasma CVD method. Of course, the first interlayer insulating film 357 is not limited to the silicon oxynitride film, and other insulating films containing silicon may be used in a single layer or a lamination structure.

Then, a process of activating the impurity element added to the semiconductor layers is performed. This activation process is performed by a thermal annealing method using an annealing furnace. The thermal annealing method may be performed in a nitrogen atmosphere with an oxygen concentration of 1 ppm or less, preferably 0.1 ppm or less and at 400 to 700° C., typically 500 to 550° C. In this embodiment, the activation process is conducted by a heat treatment for 4 hours at 550° C. Note that, in addition to the thermal annealing method, a laser annealing method or a rapid thermal annealing method (RTA method) can be applied.

Note that, in this embodiment, with the activation process, nickel used as a catalyst in crystallization is gettered to the impurity regions (350, 351, and 352) containing phosphorous at high concentration, and the nickel concentration in the semiconductor layer that becomes a channel forming region is mainly reduced. The TFT thus manufactured having the channel forming region has the lowered off current value and good crystallinity to obtain a high electric field effect mobility. Thus, the satisfactory characteristics can be attained.

Further, the activation process may be conducted before the formation of the first interlayer insulating film 357. Incidentally, in the case where the used wiring material is weak to heat, the activation process is preferably conducted after the formation of the interlayer insulating film 357 (insulating film containing silicon as its main constituent, for example, silicon nitride film) in order to protect wirings and the like as in this embodiment.

Furthermore, after the activation process the doping process is performed and the first interlayer insulating film 357 may be formed.

Moreover, a heat treatment is carried out at 300 to 550° C. for 1 to 12 hours in an atmosphere containing hydrogen of 3 to 100% to perform a process of hydrogenating the semiconductor layers. In this embodiment, the heat treatment is conducted at 410° C. for 1 hour in a nitrogen atmosphere containing hydrogen of approximately 3%. This is a process of terminating dangling bonds in the semiconductor layer by hydrogen included in the interlayer insulating film 357. As another means for hydrogenation, plasma hydrogenation (using hydrogen excited by plasma) may be performed.

In addition, in the case where the laser annealing method is used as the activation process, after the hydrogenation process, laser light emitted from an excimer laser, a YAG laser or the like is desirably irradiated.

Next, as shown in FIG. 23B, a second interlayer insulating film 358, which is made from an organic insulating material, is formed on the first interlayer insulating film 357. In this embodiment, an acrylic resin film is formed with a thickness of 1.6 µm. Then, patterning for forming contact holes that reach the respective impurity regions 333, 336, 350, and 352 are conducted.

As the second interlayer film 358, film made from insulating material containing silicon or organic resin is used. As insulating material containing silicon, silicon oxide, silicon nitride, or silicon oxynitride may be used. As the organic resin, polyimide, polyamide, acrylic, BCB (benzocyclobutene), or the like may be used.

In this embodiment, the silicon oxynitride film formed by a plasma CVD method is formed. Note that the thickness of the silicon oxynitride film is preferably 1 to 5 µm (more preferably 2 to 4 µm). The silicon oxynitride film has a little amount of moisture contained in the film itself, and thus, is effective in suppressing deterioration of the EL element.

Further, dry etching or wet etching may be used for the formation of the contact holes. However, taking the problem of electrostatic destruction in etching into consideration, the wet etching method is desirably used.

Moreover, in the formation of the contact holes here, the first interlayer insulating film 357 and the second interlayer insulating film 358 are etched at the same time. Thus, in consideration for the shape of the contact hole, it is preferable that the material with an etching speed faster than that of the material for forming the first interlayer insulating film 357 is used for the material for forming the second interlayer insulating film 358.

Then, wirings 359 to 366, which are electrically connected with the impurity regions 333, 336, 350, and 352, respectively, are formed. The wirings are formed by patterning a lamination film of a Ti film of 50 nm thickness and an alloy film (alloy film of Al and Ti) of 500 nm thickness, but other conductive films may also be used.

Subsequently, a transparent conductive film is formed thereon with a thickness of 80 to 120 nm, and by patterning the transparent conductive film, a transparent electrode 367 is formed (FIG. 23B).

Note that, in this embodiment, an indium tin oxide (ITO) film or a transparent conductive film in which indium oxide is mixed with zinc oxide (ZnO) of 2 to 20% is used as a transparent electrode 367.

Further, the transparent electrode 367 is formed so as to contact and overlap with the drain wiring 365, thereby having electrical connection with a drain region of a EL driver TFT.

Next, as shown in FIG. 24A, an insulating film containing silicon (a silicon oxide film in this embodiment) is formed with a thickness of 500 nm, and an opening portion is formed at the position corresponding to the transparent electrode 367 to thereby form a third interlayer insulating film 368 functioning as a bank. In forming the opening portion, side walls with a tapered shape may easily be formed by using the wet etching method. If the side walls of the opening portion are not sufficiently gentle, the deterioration of the EL layer caused by a step becomes a marked problem. Thus, attention is required.

Note that, in this embodiment, the silicon oxide film is used as the third interlayer insulating film 368, but depending on the situation, an organic resin film made of polyimide, polyamide, acrylic, or BCB (benzocyclobutene) may also be used.

Next, an EL layer 369 is formed by an evaporation method, and further, a cathode (MgAg electrode) 370 and a protective electrode 371 are formed by the evaporation method. At this time, before the formation of the EL layer 369 and the cathode 370, it is desirable that the transparent electrode 367 is subjected to a heat treatment to completely remove moisture. Note that the M&Ag electrode is used as the cathode of the EL element in this embodiment, but other known materials may also be used.

Note that a known material may be used for the EL layer 369. In this embodiment, the EL layer adopts a two-layer structure constituted of a hole transporting layer and a light emitting layer. However, there may be the case where a hole injecting layer, an electron injecting layer or an electron transporting layer is provided. Various examples of the combination have already been reported, and any structure of those may be used.

In this embodiment, polyphenylene vinylene is formed by the evaporation method as the hole transporting layer. Further, as the light emitting layer, a material in which 1, 3, 4-oxydiazole derivative PBD of 30 to 40% is distributed in polyvinyl carbazole is formed by the evaporation method, and coumarin 6 of approximately 1% is added as a center of green color light emission.

Further, the EL layer 369 can be protected from moisture or oxygen by the protective electrode 371, but a passivation film 372 is preferably formed. In this embodiment, a silicon nitride film of 300 nm thickness is provided as the passivation film 372. This passivation film may also be formed in succession after the formation of the protective electrode 371 without exposure to an atmosphere.

Moreover, the protective electrode 371 is provided to prevent deterioration of the cathode. 370, and is typified by a metal film containing aluminum as its main constituent. Of course, other materials may also be used. Further, the EL layer 369 and the cathode 370 are very weak to moisture. Thus, it is preferable that continuous formation is conducted up through the formation of the protective electrode 371 without exposure to an atmosphere to protect the EL layer 369 from the outside air.

Note that it is appropriate that the thickness of the EL layer 369 is 10 to 400 nm (typically 60 to 150 nm) and the thickness of the cathode 370 is 80 to 200 nm (typically 100 to 150 nm).

Thus, an EL module with the structure shown in FIG. 24A is completed. Note that, in a process of manufacturing an EL module in this embodiment, a source signal line is formed from Ta and W, which are materials forming the gate electrode, and a gate signal line is formed from Al that is a wiring material forming the source and drain electrodes, in connection with the circuit structure and the process. However, different materials may also be used.

Further, a driver circuit 506 having an n-channel TFT 501 and a p-channel TFT 502 and a pixel portion 507 having a switching TFT 503, a capacitor 505, and a EL driver TFT 504 can be formed on the same substrate.

Note that, in this embodiment, a structure in which the n-channel TFT is used as the switching TFT 503 and p-channel TFT is used as the EL driver TFT 504, respectively, is shown since the outgoing from a lower surface is adopted in accordance with the structure of the EL element. However, this embodiment is only one preferred embodiment, and the present invention is not necessarily limited to this.

The n-channel type TFT 501 of the driver circuit 506 is having the channel forming region 391, the low concentration impurity region 329 (GOLD region) overlapping with the first conductive layer 324a comprising a portion of a gate electrode, and the high concentration impurity region 333 functioning as a source region or a drain region. The p-channel type TFT 502 is having the channel forming region 392, and the impurity regions 350 and 353 functioning as a source region or a drain region.

The switching TFT 503 of the pixel portion 507 is having a channel forming region 394, the low concentration impurity region 344 (LDD region) formed outside of the gate electrode that, is not overlapping with the first conductive layer 341a forming the gate electrode, and the high concentration impurity region 336 functioning as a source region or a drain region.

The EL driver TFT 504 of the pixel portion 507 is having the channel forming region 395, and the high concentration impurity regions 352 and 355 functioning as a source region or a drain region. Moreover, the capacitor 505 is formed to have a function as an other electrode of a first conductive layer 326a and a second conductive layer 326b.

Note that, in this embodiment, although a structure in which the cathode is formed after the EL layer is formed on the pixel electrode (anode) is described, a structure in which the EL layer and the anode are formed on the pixel electrode (cathode) may be adopted. Incidentally, in this case, different from the outgoing from a lower surface described above, the outgoing from an upper surface is adopted. Furthermore, at this time, it is desirable that each of the switching TFT and the EL driver TFT is formed of the n-channel TFT.

Note that Embodiment 5 can be embodied by freely combining Embodiments 1 through 4.

Embodiment 6

The active matrix display device manufactured by employing the present invention may be used as a display portion of electric equipment. As such electric equipments, there are given a video camera, a digital camera, a projector, a projection TV, a goggle type display (head mount display), a navigation system, a sound reproduction device, a note type personal computer, a game device, a portable information terminal (such as a mobile computer, a cell phone, a portable type game device or an electronic book), an image playback device having a recording medium, and the like. Specific examples of such electric equipments are given in FIGS. 25A to 25F.

Figure 25A:
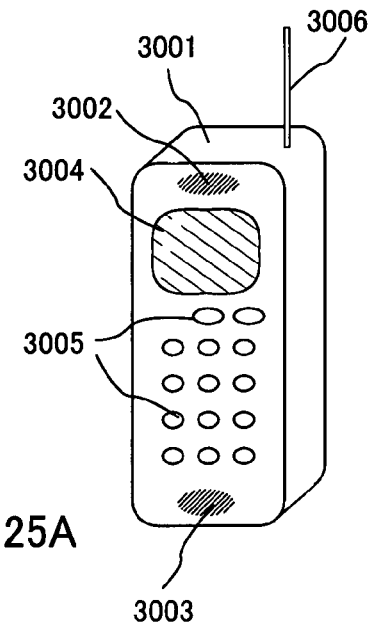
FIGS. 25A to 25F are diagrams showing examples of electronic devices.

FIG. 25A shows a cell phone that is composed of a main body 3001, a voice output portion 3002, a voice input portion 3003, a display portion 3004, operating switches 3005, and an antenna 3006. The active matrix display device of the present invention may be used in the display portion 3004.

Figure 25B:
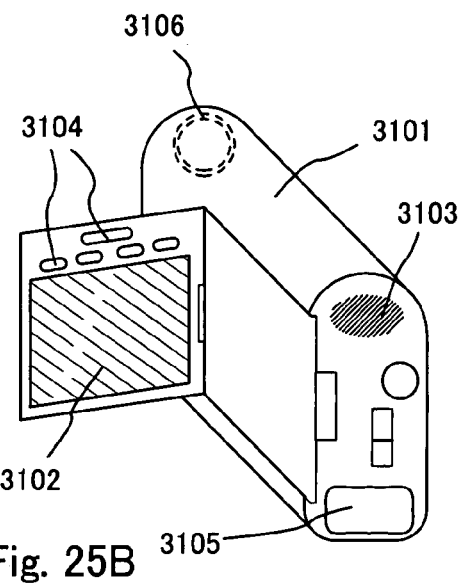

FIG. 25B shows a video camera that is composed of a main body 3101, a display portion 3102, a sound input portion 3103, operation switches 3104, a battery 3105, and an image receiving portion 3106. The active matrix display device of the present invention may be used in the display portion 3102.

Figure 25C:
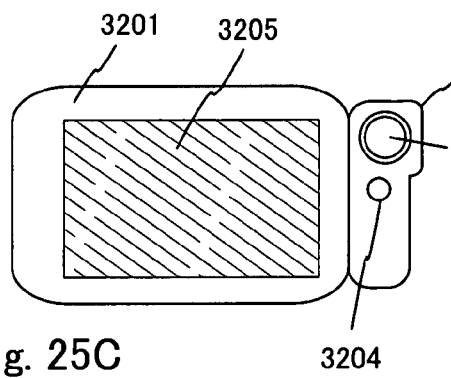

FIG. 25C shows a mobile computer that is composed of a main body 3201, a camera portion 3202, an image receiving portion 3203, an operating switch 3204 and a display portion 3205. The active matrix display device of the present invention may be used in the display portion 3205.

Figure 25D:
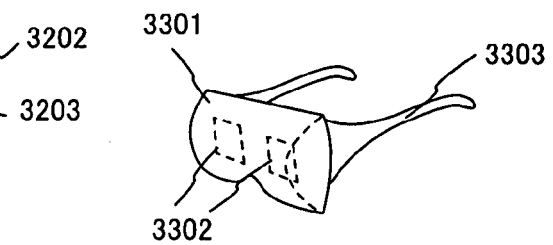

FIG. 25D shows a goggle type display that is composed of a main body 3301, display portions 3302 and arm portions 3303. The active matrix display device of the present invention may be used as the display portions 3302.

Figure 25E:
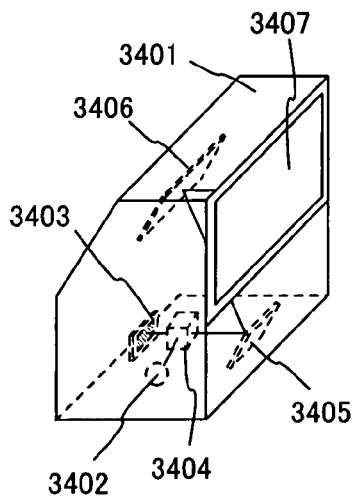

FIG. 25E shows a rear projector (projection TV) which is composed of a main body 3401, a light source 3402, a liquid crystal display device 3403, a polarized light beam splitter 3404, reflectors 3405, 3406, and a screen 3407. The present invention may be applied to the liquid crystal display device 3403.

Figure 25F:
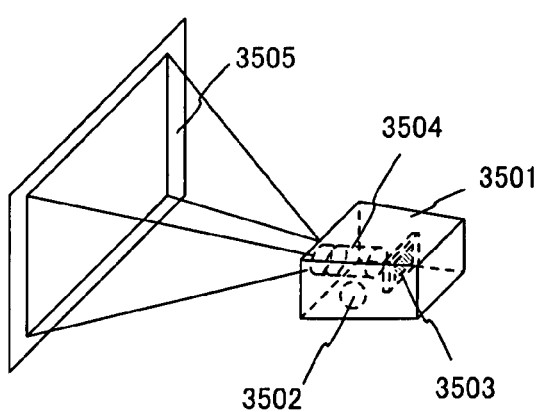

FIG. 25F shows a front projector which is composed of a main body 3501, a light source 3502, a liquid crystal display device 3503, an optical system 3504 and a screen 3505. The present invention may be applied to the liquid crystal display device 3503.

As described above, the application range of the present invention is extremely wide, and may be applied to electric equipments in all fields.

Note that the present invention can be applied not only to the TFT in which having the channel region is self-aligned to the gate electrode, but also to the TFT in which the channel region is not self-aligned to the gate electrode. Also, the differential circuit, the current mirror circuit, or the source follower circuit of the present invention may be used as a circuit other than the analog buffer of the driver circuit.

A variation in the analog buffer circuit composed of the polycrystalline TFTs has been a problem. Note that a variation can be corrected by using a correction circuit. However, since the correction circuit is required, there has been such a problem that a circuit and drive operation are complicated.

According to the present invention, the gate length and the gate width of the TFT are set to be larger. Also, a plurality of TFTs having a common gate electrode potential are connected in parallel to be used. In addition, the arrangement of the channel regions of the plurality of TFTs, which are connected in parallel, is devised. Therefore, the analog buffer circuit having a small variation as a whole is obtained without using the correction circuit, and thus a semiconductor device having a small variation can be provided.

What is claimed is:

1. A semiconductor device comprising:
    a driver circuit comprising:
        a buffer circuit comprising a first thin film transistor and a second thin film transistor formed over a substrate; and
        a logic circuit comprising a third thin film transistor formed over the substrate,
    wherein the first thin film transistor comprises a channel forming region, a first impurity region and a second impurity region, and an impurity concentration of the first impurity region is higher than an impurity concentration of the second impurity region,
    wherein a length of the channel forming region of the first thin film transistor is 7 µm or longer,
    wherein the length of the channel forming region of the first thin film transistor is twice or more as compared with a length of a channel forming region of the third thin film transistor, and
    wherein a source or a drain electrode of the first thin film transistor is electrically connected to a source or a drain electrode of the second thin film transistor in series.

2. A semiconductor device according to claim 1, wherein the first thin film transistor comprises a polycrystalline semiconductor layer.

3. A semiconductor device according to claim 1, wherein the buffer circuit is an analog buffer.

4. A semiconductor device according to claim 1, wherein the logic circuit comprises a shift register circuit.

5. A semiconductor device according to claim 1, wherein the logic circuit comprises a latch circuit.

6. A semiconductor device according to claim 1 further comprising a pixel portion.

7. A semiconductor device according to claim 1, wherein the second impurity region overlaps with a gate electrode of the first thin film transistor.

8. A semiconductor device comprising:
    a driver circuit comprising:
        a buffer circuit comprising a first thin film transistor and a second thin film transistor formed over a substrate; and
        a logic circuit comprising a third thin film transistor formed over the substrate,
    wherein the first thin film transistor comprises a channel forming region, a first impurity region and a second impurity region, and an impurity concentration of the first impurity region is higher than an impurity concentration of the second impurity region,
    wherein a width of the channel forming region of the first thin film transistor is 50 µm or longer,
    wherein a length of the channel forming region of the first thin film transistor is twice or more as compared with a length of a channel forming region of the third thin film transistor, and
    wherein a source or a drain electrode of the first thin film transistor is electrically connected to a source or a drain electrode of the second thin film transistor in series.

9. A semiconductor device according to claim 8, wherein the first thin film transistor comprises a polycrystalline semiconductor layer.

10. A semiconductor device according to claim 8, wherein the buffer circuit is an analog buffer.

11. A semiconductor device according to claim 8, wherein the logic circuit comprises a shift register circuit.

12. A semiconductor device according to claim 8, wherein the logic circuit comprises a latch circuit.

13. A semiconductor device according to claim 8 further comprising a pixel portion.

14. A semiconductor device according to claim 8, wherein the second impurity region overlaps with a gate electrode of the first thin film transistor.

15. A semiconductor device comprising:
    a driver circuit comprising:
        a buffer circuit comprising a first n-channel type thin film transistor and first p-channel type thin film transistor formed over a substrate; and
        a logic circuit comprising a second n-channel type thin film transistor and second p-channel type thin film transistor formed over the substrate,
    wherein the first n-channel type thin film transistor comprises a channel forming region, a first impurity region and a second impurity region, and an impurity concentration of the first impurity region is higher than an impurity concentration of the second impurity region,
    wherein a length of the channel forming region of the first n-channel type thin film transistor is 7 µm or longer,
    wherein the length of the channel forming region of the first n-channel type thin film transistor is twice or more as compared with a length of a channel forming region of the second n-channel type thin film transistor, and
    wherein a source or a drain electrode of the first n-channel type thin film transistor is electrically connected to a source or a drain electrode of the first p-channel type thin film transistor in series.

16. A semiconductor device according to claim 15, wherein the first n-channel type thin film transistor comprises a polycrystalline semiconductor layer.

17. A semiconductor device according to claim 15, wherein the buffer circuit is an analog buffer.

18. A semiconductor device according to claim 15, wherein the logic circuit comprises a shift register circuit.

19. A semiconductor device according to claim 15, wherein the logic circuit comprises a latch circuit.

20. A semiconductor device according to claim 15 further comprising a pixel portion.

21. A semiconductor device according to claim 15, wherein the second impurity region overlaps with a gate electrode of the first n-channel type thin film transistor.

22. A semiconductor device comprising:
a driver circuit comprising:
   a buffer circuit comprising a first n-channel type thin film transistor and first p-channel type thin film transistor formed over a substrate; and
   a logic circuit comprising a second n-channel type thin film transistor and second p-channel type thin film transistor formed over the substrate,
wherein the first n-channel type thin film transistor comprises a channel forming region, a first impurity region and a second impurity region, and an impurity concentration of the first impurity region is higher than an impurity concentration of the second impurity region,
wherein a width of the channel forming region of the first n-channel type thin film transistor is 50 μm or longer,
wherein a length of the channel forming region of the first n-channel type thin film transistor is twice or more as compared with a length of a channel forming region of the second n-channel type thin film transistor, and
wherein a source or a drain electrode of the first n-channel type thin film transistor is electrically connected to a source or a drain electrode of the first p-channel type thin film transistor in series.

23. A semiconductor device according to claim 22, wherein the first n-channel type thin film transistor comprises a polycrystalline semiconductor layer.

24. A semiconductor device according to claim 22, wherein the buffer circuit is an analog buffer.

25. A semiconductor device according to claim 22, wherein the logic circuit comprises a shift register circuit.

26. A semiconductor device according to claim 22, wherein the logic circuit comprises a latch circuit.

27. A semiconductor device according to claim 22 further comprising a pixel portion.

28. A semiconductor device according to claim 22, wherein the second impurity region overlaps with a gate electrode of the first n-channel type thin film transistor.

29. A semiconductor device comprising:
a driver circuit comprising:
   a buffer circuit comprising a first thin film transistor and a second thin film transistor formed over a substrate; and
   a logic circuit comprising a third thin film transistor formed over the substrate,
wherein the first thin film transistor comprises a channel forming region, a first impurity region and a second impurity region, and an impurity concentration of the first impurity region is higher than an impurity concentration of the second impurity region,
wherein a length of the channel forming region of the first thin film transistor is 7 μm or longer,
wherein the length of the channel forming region of the first thin film transistor is twice or more as compared with a length of a channel forming region of the third thin film transistor, and
wherein a source or a drain electrode of the first thin film transistor is electrically connected to a source or a drain electrode of the second thin film transistor in series.

30. A semiconductor device according to claim 29, wherein the first thin film transistor comprises a polycrystalline semiconductor layer.

31. A semiconductor device according to claim 29, wherein the buffer circuit is an analog buffer.

32. A semiconductor device according to claim 29, wherein the logic circuit comprises a shift register circuit.

33. A semiconductor device according to claim 29, wherein the logic circuit comprises a latch circuit.

34. A semiconductor device according to claim 29 further comprising a pixel portion.

35. A semiconductor device according to claim 29, wherein the second impurity region overlaps with a gate electrode of the first thin film transistor.

* * * * *